(12) United States Patent
Cha et al.

(10) Patent No.: US 12,396,344 B2
(45) Date of Patent: Aug. 19, 2025

(54) DISPLAY DEVICE WITH HOLE SURROUNDED BY DATA LINES IN DIFFERENT LAYERS

(71) Applicant: SAMSUNG DISPLAY CO., LTD., Yongin-si (KR)

(72) Inventors: Hyun Ji Cha, Gwangju (KR); Yun Kyeong In, Hwaseong-si (KR); Young Soo Yoon, Seoul (KR); Min Hee Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/617,547

(22) Filed: Mar. 26, 2024

(65) Prior Publication Data
US 2024/0237447 A1 Jul. 11, 2024

Related U.S. Application Data

(63) Continuation of application No. 17/929,519, filed on Sep. 2, 2022, now Pat. No. 11,950,470, which is a
(Continued)

(30) Foreign Application Priority Data

Feb. 27, 2019 (KR) .......................... 10-2019-0023263

(51) Int. Cl.
*H10K 59/131* (2023.01)
*H10K 59/121* (2023.01)
(Continued)

(52) U.S. Cl.
CPC ....... *H10K 59/131* (2023.02); *H10K 59/1213* (2023.02); *H10K 59/123* (2023.02); *H10D 86/441* (2025.01); *H10D 86/60* (2025.01)

(58) Field of Classification Search
CPC ............. H10K 59/131; H10K 59/1213; H10K 59/123; H01L 27/124
See application file for complete search history.

(56) References Cited

U.S. PATENT DOCUMENTS 10,923,028 B2   2/2021  Lin et al.
11,950,470 B2 * 4/2024  Cha ................... H10K 59/1213
(Continued)

FOREIGN PATENT DOCUMENTS

CN    103258477 A    8/2013
CN    107293567 A    10/2017
(Continued)

OTHER PUBLICATIONS

Chinese Office Action dated Dec. 11, 2023, issued in corresponding Chinese Patent Application No. 202010124243.1 (7 pages).

*Primary Examiner* — Lex H Malsawma
(74) *Attorney, Agent, or Firm* — Womble Bond Dickinson (US) LLP

(57) ABSTRACT

A display device comprising: first and second pixels; a first data line connected to the first pixel and configured to have data voltages applied thereto; and a second data line connected to the second pixel, the second data line being adjacent to the first data line, and configured to have the data voltages applied thereto, wherein the first data line includes a 1A-th data line which is in a first data layer, and the second data line includes a 2B-th data line which is in a second data layer different from the first data layer.

20 Claims, 21 Drawing Sheets

Related U.S. Application Data continuation of application No. 16/800,652, filed on Feb. 25, 2020, now Pat. No. 11,437,460.

(51) Int. Cl.
*H10K 59/123* (2023.01)
*H10D 86/40* (2025.01)
*H10D 86/60* (2025.01)

(56) References Cited

U.S. PATENT DOCUMENTS

| | | | |
|---|---|---|---|
| 2005/0023521 | A1 | 2/2005 | Murade |
| 2008/0117497 | A1 | 5/2008 | Shimodaira |
| 2017/0154566 | A1 | 6/2017 | Ryoo et al. |
| 2017/0162637 | A1 | 6/2017 | Choi et al. |
| 2017/0294502 | A1* | 10/2017 | Ka .................. H10K 59/123 |
| 2018/0322844 | A1 | 11/2018 | Lee et al. |

FOREIGN PATENT DOCUMENTS

| | | | |
|---|---|---|---|
| CN | 108269834 | A | 7/2018 |
| CN | 109087590 | A | 12/2018 |
| JP | 5955298 | B2 | 7/2016 |
| KR | 10-2008-0045637 | A | 5/2008 |
| KR | 10-2017-0066767 | A | 6/2017 |
| KR | 10-2017-0117291 | A | 10/2017 |

* cited by examiner

DISPLAY DEVICE WITH HOLE SURROUNDED BY DATA LINES IN DIFFERENT LAYERS

CROSS-REFERENCE TO RELATED APPLICATIONS

This application is a continuation of U.S. patent application Ser. No. 17/929,519, filed Sep. 2, 2022, which is a continuation of U.S. patent application Ser. No. 16/800,652, filed Feb. 25, 2020, now U.S. Pat. No. 11,437,460, which claims priority to and the benefit of Korean Patent Application No. 10-2019-0023263, filed Feb. 27, 2019, the entire content of all of which is incorporated herein by reference.

BACKGROUND

1. Field

Aspects of some example embodiments of the present disclosure relate to a display device.

2. Description of the Related Art

As the information society develops, the demand for display devices for displaying images has increased and diversified. For example, display devices have been applied to a variety of electronic devices such as smart phones, digital cameras, notebook computers, navigation devices, smart televisions (TVs), or the like. Examples of the display devices include flat panel display devices such as a liquid crystal display (LCD) device, a field emission display (FED) device, an organic light-emitting diode (OLED) display device, or the like.

The OLED display device includes self-luminous elements capable of allowing the pixels of a display panel to emit light and can thus display images without a requirement of a backlight unit that provides light to the display panel. Accordingly, the OLED display device can be designed in various forms and shapes, as compared to other display devices.

The above information disclosed in this Background section is only for enhancement of understanding of the background and therefore the information discussed in this Background section does not necessarily constitute prior art.

SUMMARY

Aspects of some example embodiments of the present disclosure include a display device having a through hole in a display area thereof.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to some example embodiments of the present disclosure, a display device includes: first and second pixels; a first data line connected to the first pixel and having data voltages applied thereto; and a second data line connected to the second pixel, adjacent to the first data line, and having the data voltages applied thereto, wherein the first data line includes a 1A-th data line which is in a first data layer, and the second data line includes a 2B-th data line which is in a second data layer disposed in a different layer from the first data layer.

According to some example embodiments of the present disclosure, a display device includes: first and second pixels; a first data line connected to the first pixel and having data voltages applied thereto; and a second data line connected to the second pixel, adjacent to the first data line, and having the data voltages applied thereto, wherein the first data line includes a 2A-th data line which is in a second data layer, the second data line includes a 2B-th data line which is disposed in the second data layer, the 2B-th data line is connected to the second pixel through a first data bridge electrode, and the 2A-th data line is connected to the first pixel through a second data bridge electrode.

According to some example embodiments of the present disclosure, a display device includes: a first substrate having defined thereon a first through hole area where a first through hole is formed, a first wiring area which surrounds the first through hole area, and a pixel area where pixels are disposed to surround the first wiring area; and first and second data lines on the first substrate to be adjacent to each other, wherein the first data line includes a plurality of metal layers in the pixel area and includes a second metal layer of the plurality of metal layers in the first wiring area.

According to some example embodiments of the present disclosure, there is provided a display device comprising: a first substrate having defined thereon a through hole area where a through hole is formed, a wiring area which surrounds the through hole area, and a pixel area where pixels are to surround the wiring area; and first and second data lines on the first substrate to be adjacent to each other, wherein the first data line includes a first metal layer in both the pixel area and the wiring area, and the second data line includes a second metal layer in both the pixel area and the wiring area.

According to some example embodiments of the present disclosure, there is provided a display device comprising: a first substrate having defined thereon a through hole area where a through hole is formed, a wiring area which surrounds the through hole area, and a pixel area where pixels are located to surround the wiring area; and first and second data lines on the first substrate to be adjacent to each other, wherein the first data line includes a first metal layer in the wiring area and a second metal layer in the pixel area, and the second data line includes the second metal layer in both the pixel area and the wiring area.

According to the aforementioned and other embodiments of the present disclosure, a camera device overlaps with a through hole formed in a display area of a display panel and can thus capture an image of the background at the front of the display panel through the through hole and a camera hole. That is, the camera device may be positioned to overlap with the display area, rather than with a non-display area of the display panel, and as a result, the display area of the display panel can be widened.

In addition, because first and second data lines that are adjacent to each other do not need any bridge electrodes in a wiring area, the load of the first and second data lines can be prevented from increasing due to the presence of bridge electrodes. Also, any difference between the load of the first and second data lines that pass through a wiring area and the load of data lines that do not pass through the wiring area can be minimized.

Other features and embodiments may be apparent from the following detailed description, the drawings, and the claims.

BRIEF DESCRIPTION OF THE DRAWINGS

The above and other embodiments and aspects of the present disclosure will become more apparent by describing in more detail embodiments thereof with reference to the attached drawings, in which.

DETAILED DESCRIPTION

Aspects of some example embodiments of the present invention will now be described more fully hereinafter with reference to the accompanying drawings, in which example embodiments of the invention are shown. This invention may however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, aspects of some example embodiments of the present invention will be described with reference to the attached drawings.

Figure 1:
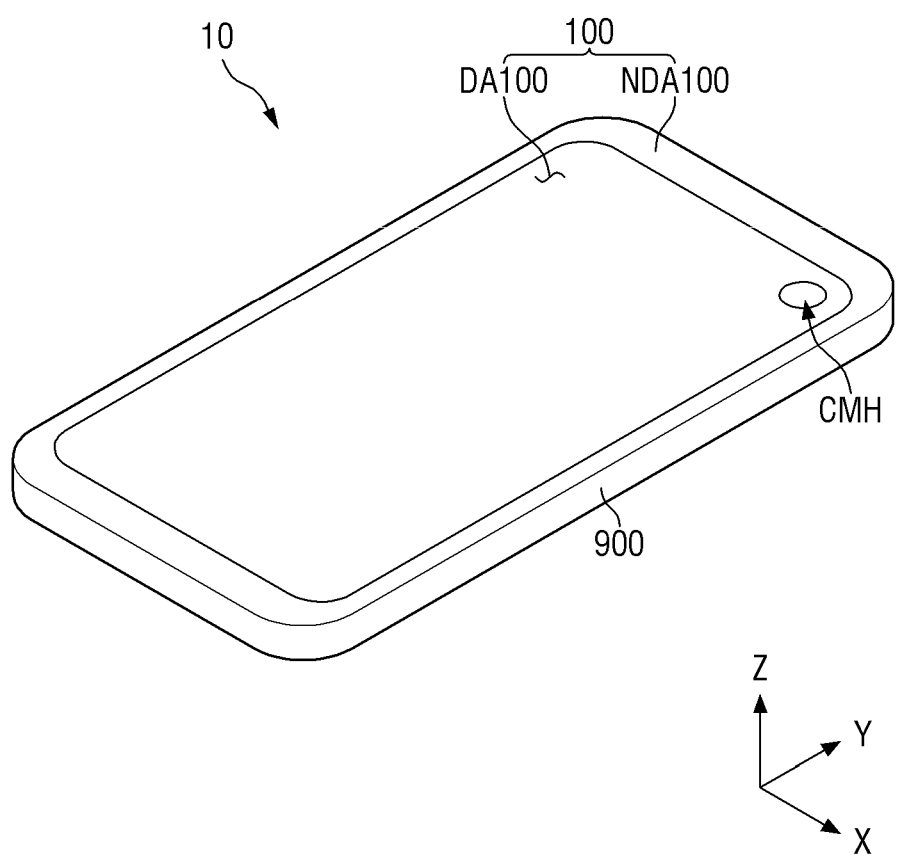
FIG. 1 is a perspective view of a display device according to some example embodiments of the present disclosure.
Figure 2:
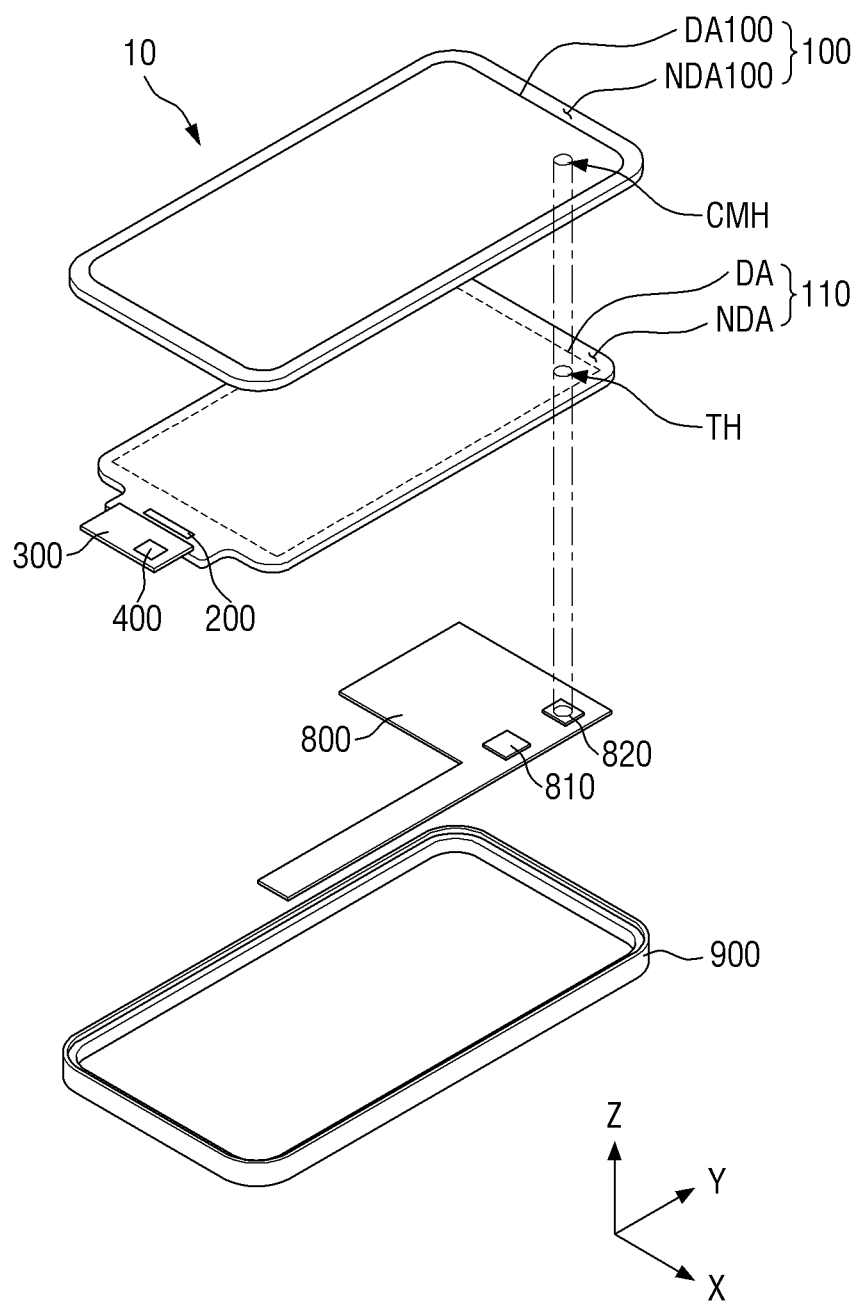
FIG. 2 is an exploded perspective view of the display device of FIG. 1.

FIG. 1 is a perspective view of a display device according to some example embodiments of the present disclosure. FIG. 2 is an exploded perspective view of the display device of FIG. 1.

Referring to FIGS. 1 and 2, a display device 10 may be a mobile terminal. Examples of the mobile terminal include a smartphone, a tablet personal computer (PC), a personal digital assistant (PDA), a portable multimedia player (PMP), a gaming console, a wristwatch-type electronic device, and the like. However, the display device 10 is not limited to being the mobile terminal, but may be used in a large-size electronic device such as a television (TV) or an outdoor billboard or in a mid- or small-size electronic device such as a monitor, a notebook computer, a car navigation device, or a camera.

The display device 10 includes a cover window 100, a display panel 110, a first driving circuit unit 200, a display circuit board 300, a second driving circuit unit 400, a main circuit board 800, a main processor 810, a camera device 820, and a lower cover 900.

The terms "above", "top", and "top surface", as used herein, denote a direction in which the cover window 100 is arranged with respect to the display panel 110, i.e., a Z-axis direction, and the terms "below", "bottom", and "bottom surface", as used herein, denote a direction in which the lower cover 900 is arranged with respect to the display panel 110, i.e., the direction opposite to the Z-axis direction. Also, the terms "left", "right", "upper", and "lower", as used herein, denote their respective directions as viewed from above the display panel 110. For example, the term "left" denotes an X-axis direction, the term "right" denotes the direction opposite to the X-axis direction, the term "upper" denotes a Y-axis direction, and the term "lower" denotes the direction opposite to the Y-axis direction.

The display device 10 may have a rectangular shape in a plan view. For example, in a plan view, the display device 10 may have a rectangular shape having a pair of short sides extending in a first direction (or the X-axis direction) and a pair of long sides extending in a second direction (or the Z-axis direction). The corners at which the short sides and the long sides of the display device 10 meet may be rounded or right-angled. The planar shape of the display device 10 is not particularly limited, and the display device 10 may be formed in another polygonal shape, a circular shape, or an elliptical shape in a plan view.

The cover window 100 may be located above the display panel 110 to cover the top surface of the display panel 110. Accordingly, the cover window 100 can protect the top surface of the display panel 110. The cover window 100 may be attached to a touch sensing device via an adhesive member. The adhesive member may be an optically clear adhesive (OCA) or an optically clear resin (OCR).

The cover window 100 may be formed of glass, sapphire, and/or plastic. The cover window 100 may be rigid or flexible.

The cover window 100 may include a light-transmitting part DA100 which corresponds to a display area DA of the display panel 110 and a light-shielding part NDA100 which corresponds to a non-display area NDA of the display panel 110. A camera hole CMH which penetrates the cover window 100 may be formed in the light-transmitting part DA100 of the cover window 100. The camera hole CMH may overlap with a through hole TH of the display panel 110. The light-shielding part NDA100 of the cover window 100 may be opaque. Alternatively, the light-shielding part NDA100 of the cover window 100 may be formed as a decorative layer with patterns formed thereon that can be viewed to a user when no images are displayed. For example, a company's logo or a string of various characters may be patterned on the light-shielding part NDA100 of the cover window 100.

The display panel 110 may be located below the cover window 100. The display panel 110 may include the display area DA and the non-display area NDA. The display area DA may be an area in which images are displayed, and the non-display area NDA may be an area in which no images are displayed and may be located on the periphery of the display area DA. The non-display area NDA may be located to surround the display area DA, as illustrated in FIG. 2, but the present disclosure is not limited thereto. The display area DA may overlap with the light-transmitting part DA 100 of the cover window 100, and the non-display area NDA may overlap with the light-shielding part NDA100 of the cover window 100. In the display are DA of the display panel 110, the through hole TH, which penetrates the display panel 110, may be formed. The through hole TH may overlap with the camera hole CMH of the cover window 100 and with the camera device 820 of the main circuit board 800.

The display panel 110 may be a light-emitting diode (LED) display panel including LEDs. For example, the display panel 110 may be an organic LED (OLED) display panel using OLEDs, a micro-LED (mLED) display panel using mLEDs, or a quantum dot LED (QLED) display panel using QLEDs. The display panel 110 will be described later with reference to FIGS. 3 and 4, assuming that the display panel 110 is an OLED display panel.

A polarizing film may be attached to the top surface of the display panel 110 to prevent visibility degradation that may be caused by the reflection of external light. The polarizing film may be a λ/2 (or half-wave) plate or a λ/4 (or quarter-wave) plate.

The first driving circuit unit 200 may be located on a first side of the display panel 110. The first driving circuit unit 200 may output signals and voltages for driving the pixels of a display unit of the display panel 110. The first driving circuit unit 200 may be formed as an integrated circuit (IC) and may be attached on a first substrate in a chip-on-glass (COG) or chip-on-plastic (COP) manner.

The display circuit board 300 may be attached to the first side of the display panel 110. For example, the display circuit board 300 may be attached, via an anisotropic conductive film, on pads provided on the first side of the display panel 110. The pads of the display panel 110 may be located on the outer side of the first driving circuit unit 200.

The second driving circuit unit 400 may be located on the display circuit board 300. The second driving circuit unit 400 may output touch driving signals for driving touch electrodes of a touch sensing layer and may detect the capacitances of the touch electrodes. The second driving circuit unit 400 may be formed as an IC. The second driving circuit unit 400 not only can detect the presence of touch input, but also can calculate the touch coordinates of the touch input, based on the capacitances of the touch electrodes.

A panel bottom member may be located on the bottom surface of the display panel 110. The panel bottom member may include at least one of a heat dissipation layer for efficiently releasing heat from the display panel 110, an electromagnetic wave shielding layer for shielding electromagnetic waves, a light-shielding layer for shielding incident light from the outside, a light-absorbing layer for absorbing incident light from the outside, and a buffer layer for absorbing external impact.

The main circuit board 800 may be located below the display panel 110. The main circuit board 800 may be connected to the display circuit board 300 via a cable. Accordingly, the first driving circuit unit 200, which is located on the display panel 110, the second driving circuit unit 400 of the display circuit board 300, and the main processor 810 of the main circuit board 800 may be electrically connected to one another. The main circuit board 800 may be a printed circuit board (PCB) or a flexible PCB (FPCB).

The main processor 810 and the camera device 820 may be located on the main circuit board 800. A mobile communication module capable of transmitting wireless signals to, or receiving wireless signals from, a base station, an external terminal, and a server via a mobile communication network and a sound module for outputting sound may be further located on the main circuit board 800. Examples of the wireless signals include voice signals, video call signals, and a variety of data that can be transmitted along with text/multimedia messages.

The main processor 810 may control all the functions of the display device 10. For example, the main processor 810 may output digital video data and timing signals to the first driving circuit unit 200 via the display circuit board 300 so as for the display panel 110 to display images. Also, the main processor 810 may receive touch coordinate data, including touch row data or touch coordinates, from the second driving circuit unit 400 and may execute an application displayed at a touch location. Also, the main processor 810 may control the driving of the camera device 820. The main processor 810 may be an application processor implemented as an IC.

The camera device 820 may overlap with the through hole TH of the display panel 110. Accordingly, the camera device 820 may capture an image of the background at the front of the display panel 110 through the through hole TH and the camera hole CMH. The camera device 820 may be a complementary metal oxide semiconductor (CMOS) image sensor or a charge coupled device (CCD) image sensor. The camera device 820 may process image frames such as still images or moving images obtained by an image sensor.

A lower frame may be located between the display panel 110 and the main circuit board 800. The lower frame may be formed to surround the bottom surface and/or the side surfaces of the display panel 110. The lower frame may include a synthetic resin and/or a metal.

The lower cover 900 may be located below the main circuit board 800. The lower cover 900 may form the bottom exterior of the display device 10. The lower cover 900 may include plastic and/or a metal.

In the embodiment of FIGS. 1 and 2, the camera device 820 may overlap with the through hole TH, which is formed in the display area DA of the display panel 110, and may capture an image of the background at the front of the display panel 110 through the through hole TH and the camera hole CMH. That is, the camera device 820 may be arranged to overlap with the display area DA, rather than with the non-display area NDA, and as a result, the display area DA of the display panel 110 can be widened.

Figure 3:
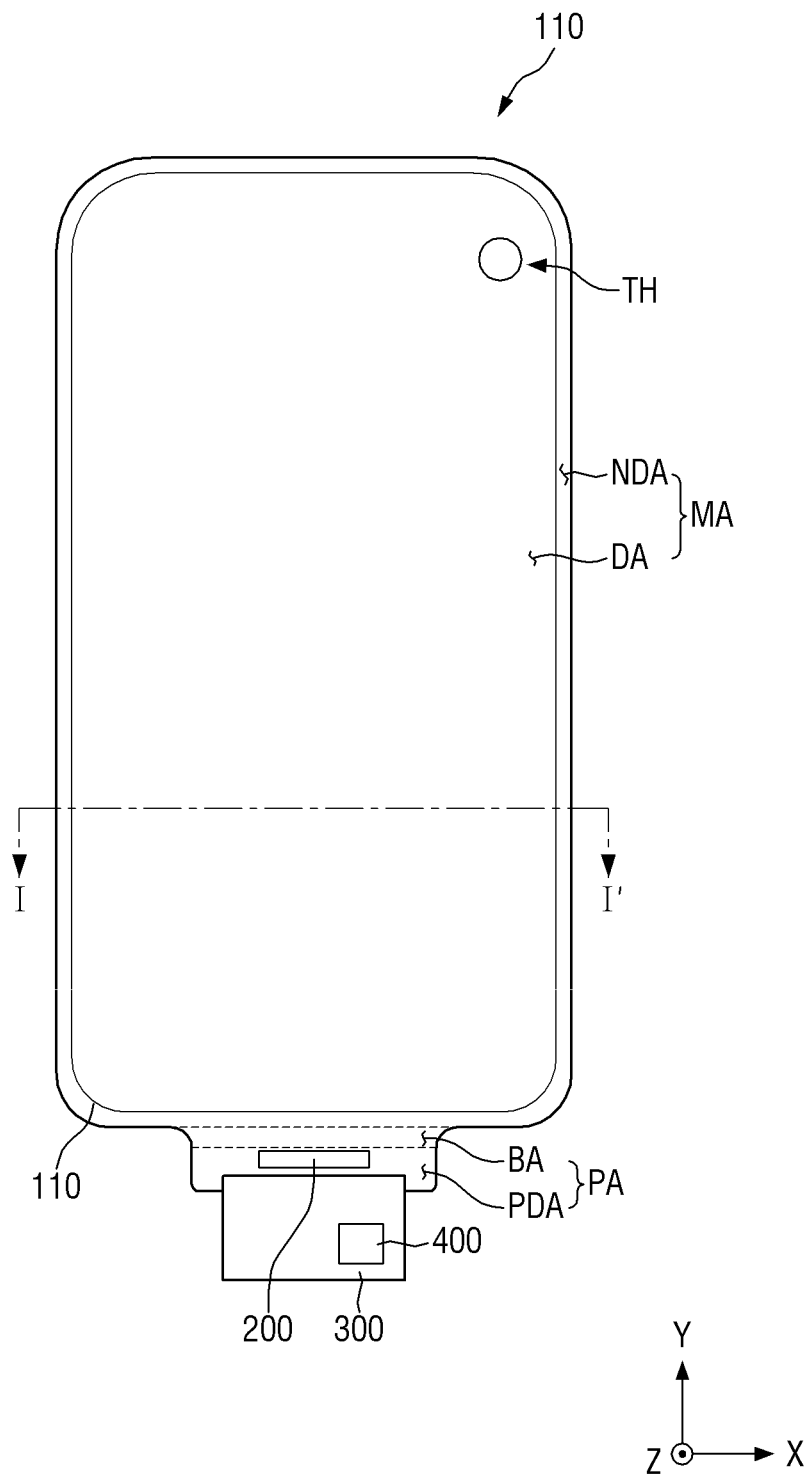
FIG. 3 is a plan view illustrating a display panel of FIG. 1.

FIG. 3 is a plan view illustrating the display panel of FIG. 1.

Referring to FIG. 3, the display panel 110 may include a main area MA and a protruding area PA which protrudes from one side of the main area MA.

The main area MA may be formed in a rectangular shape having a pair of short sides extending in the first direction (or the X-axis direction) and a pair of long sides extending in the second direction (or the Y-axis direction) in a plan view. The corners at which the short sides and the long sides of the main area MA meet may be rounded with a predetermined curvature or may be right-angled. The planar shape of the main area MA is not particularly limited, and the main area MA may be formed in another polygonal shape, a circular shape, or an elliptical shape in a plan view. The main area MA may be flat, but the present disclosure is not limited thereto. The main area MA may include curved parts on both sides thereof, in which case, the curved parts may have a uniform or varying curvature.

The main area MA may include the display area DA in which pixels are formed to display images and the non-display area NDA which is on the periphery of the display area DA.

Not only the pixels, but also scan lines and data lines which are connected to the pixels may be located in the display area DA. In the display area DA, the through hole TH, which penetrates the display panel 110, may be formed. In the through hole TH, the pixels, the scan lines, and the data lines are not formed. In a case where the main area MA includes the curved parts, the display area DA may also be located on the curved parts. In this case, images displayed by the display panel 110 can be viewed even from the curved parts.

The non-display area NDA may be defined as an area ranging from the edges of the display area DA to the edges of the display panel 110. In the non-display area NDA, a scan driver for applying scan signals to the scan lines and link lines which connect the data lines and the first driving circuit unit 200 may be located.

The protruding area PA may protrude from one side of the main area MA. For example, the protruding area PA may protrude from the lower side of the main area MA, as illustrated in FIG. 3. The length, in the first direction (or the X-axis direction), of the protruding area PA may be smaller than the length, in the first direction (or the X-axis direction), of the main area MA.

The protruding area PA may include a bending area BA and a pad area PDA. In this case, the pad area PDA may be located on one side of the bending area BA, and the main area MA may be located on the other side of the bending area BA. For example, the pad area PDA may be located on the lower side of the bending area BA, and the main area MA may be located on the upper side of the bending area BA.

The display panel 110 may be formed to be flexible and may thus be foldable, bendable, or rollable. Thus, the display panel 110 can be bent in the bending area BA in a thickness direction (or the Z-axis direction). In this case, the pad area PDA of the display panel 110 may face upward when the display panel 110 is yet to be bent, and may face downward once the display panel 110 is bent. Because the pad area PDA is located below the main area MA when the display panel 110 is bent, the pad area PDA may overlap with the main area MA.

In the pad area PDA of the display panel 110, the first driving circuit unit 200 and pads electrically connected to the display circuit board 300 may be located.

The first driving circuit unit 200 outputs signals and voltages for driving the display panel 110. For example, the first driving circuit unit 200 may supply data voltages to the data lines. The first driving circuit unit 200 may also supply scan control signals to the scan driver. The first driving circuit unit 200 may be formed as an IC and may be mounted on the display panel 110 (particularly, in the pad area PDA) in a COG, COP, or ultrasonic bonding manner, but the present disclosure is not limited thereto. Alternatively, the first driving circuit unit 200 may be mounted on the display circuit board 300.

The pads located in the pad area PDA may include display pads which are electrically connected to the first driving circuit unit 200 and touch pads which are electrically connected to touch lines.

The display circuit board 300 may be attached on pads via an anisotropic conductive film. As a result, lead lines of the display circuit board 300 can be electrically connected to the pads. The display circuit board 300 may be a flexible film such as an FPCB, a PCB, or a chip-on-film (COF).

The second driving circuit unit 400 may be connected to the touch electrodes of the touch sensor layer of the display panel 110. The second driving circuit unit 400 applies driving signals to the touch electrodes of the touch sensor layer and measures the capacitances of the touch electrodes of the touch sensor layer. The driving signals may be signals having multiple driving pulses. The second driving circuit unit 400 not only can determine the presence of touch input, but also can calculate the touch coordinates of the touch input, based on the capacitances of the touch electrodes of the touch sensor layer.

The second driving circuit unit 400 may be located on the display circuit board 300. The second driving circuit unit 400 may be formed as an IC and may be mounted on the display circuit board 300.

Figure 4:
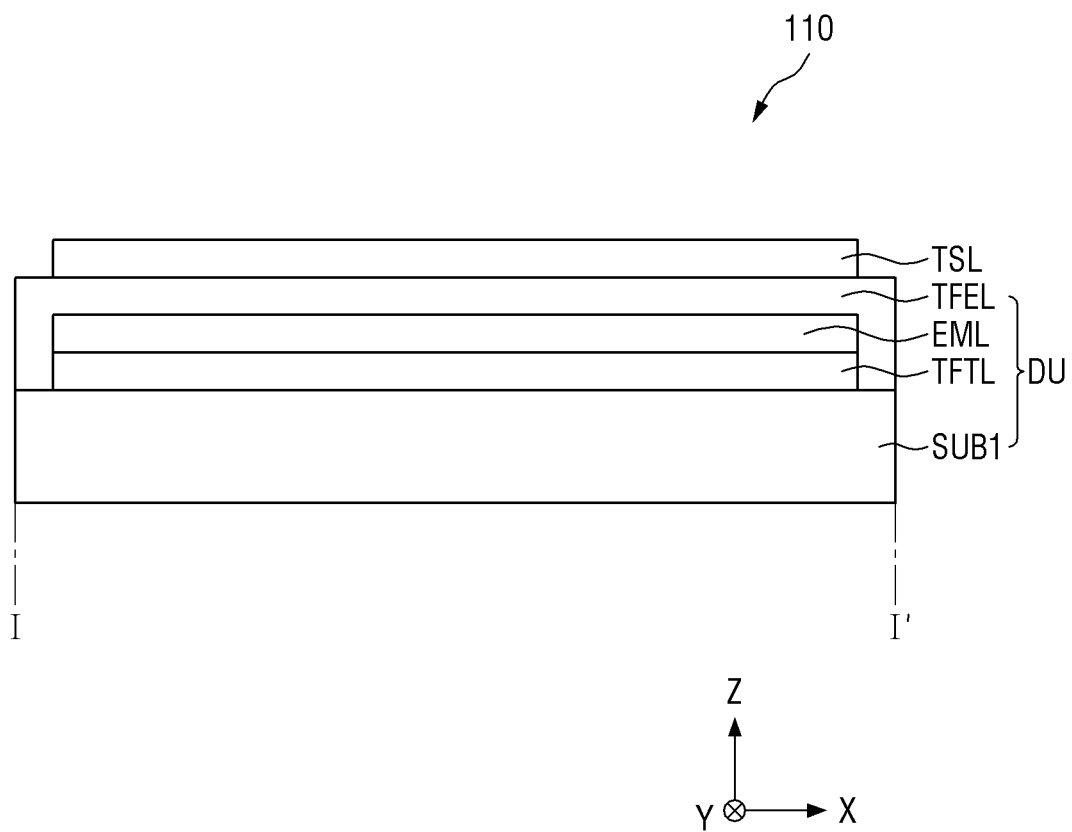
FIG. 4 is a cross-sectional view taken along the line I-I' of FIG. 3.

FIG. 4 is a cross-sectional view taken along line I-I' of FIG. 3.

Referring to FIG. 4, the display panel 110 may include a display unit DU and a touch sensing unit (or touch sensor layer TSL). The display unit DU includes a first substrate SUB1 and a thin-film transistor (TFT) layer TFTL, a light-emitting element layer EML, and a thin-film encapsulation layer TFEL which are located on the first substrate SUB1, and the touch sensing unit includes a touch sensor layer TSL.

The first substrate SUB1 may be formed of an insulating material such as glass, quartz, or a polymer resin. Examples of the polymer resin include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and a combination thereof. Alternatively, the first substrate SUB1 may include a metal material.

The first substrate SUB1 may be a rigid substrate or a flexible substrate that is bendable, foldable, or rollable. In a case where the first substrate SUB1 is a flexible substrate, the first substrate SUB1 may be formed of PI, but the present disclosure is not limited thereto.

Figure 5:
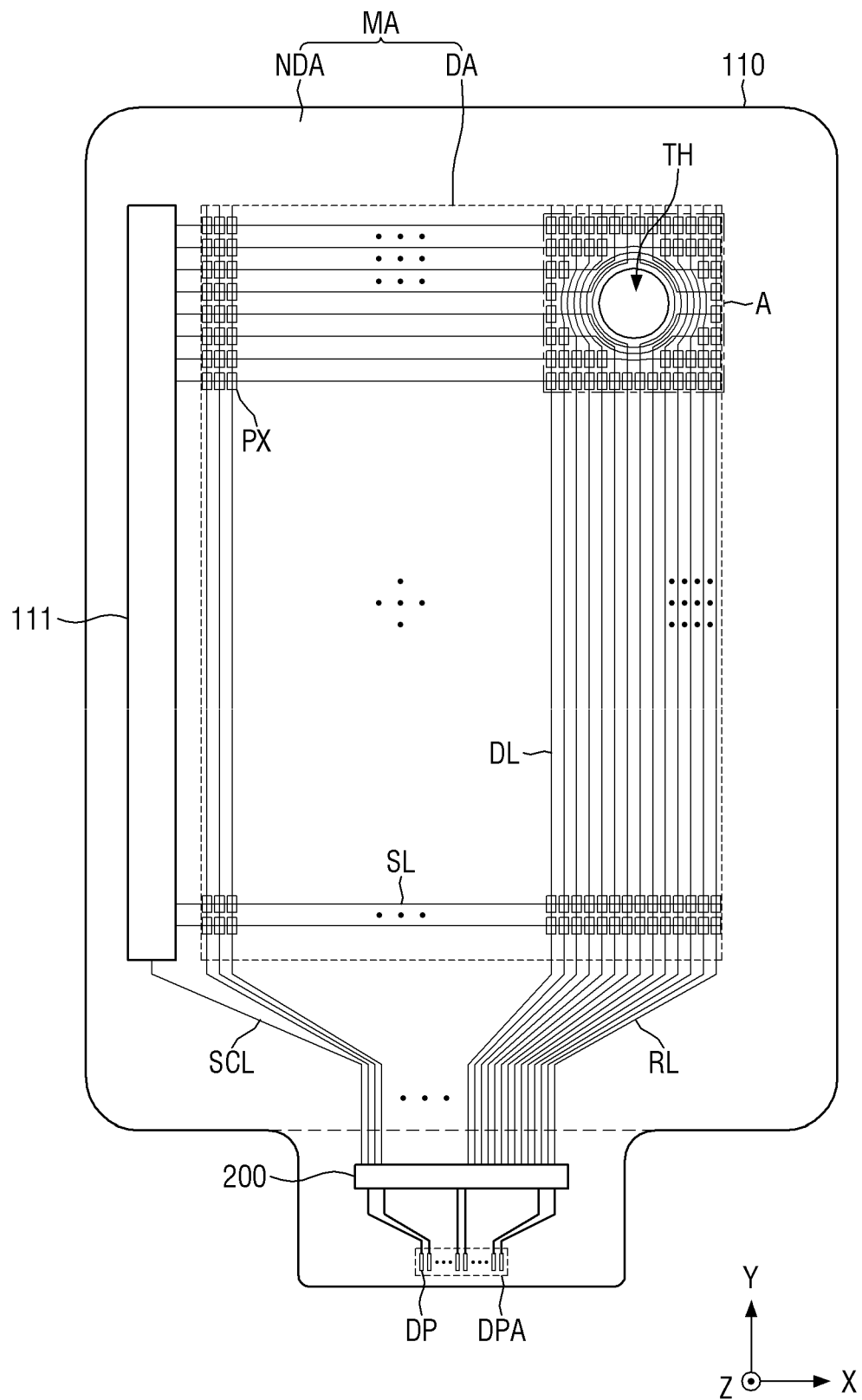
FIG. 5 is a plan view illustrating an example of a display unit of FIG. 4.

The TFT layer TFTL may be located on the first substrate SUB1. In the TFT layer TFTL, TFTs of each of the pixels, the scan lines, the data lines, power lines, scan control lines, and routing lines that connect pads and the data lines may be formed. Each of the TFTs may include a gate electrode, a semiconductor layer, a source electrode, and a drain electrode. In a case where a scan driver 111 is formed in the non-display area NDA of the display panel 110, as illustrated in FIG. 5, the scan driver 111 may include the TFTs.

The TFT layer TFTL may be located in the display area DA and in the non-display area NDA. For example, the TFTs of each of the pixels and the scan lines, the data lines, and the power lines of the TFT layer TFTL may be located in the display area DA. The scan control lines and the routing lines of the TFT layer TFTL may be located in the non-display area NDA.

The light-emitting element layer EML may be located on the TFT layer TFTL. The light-emitting element layer EML may include the pixels, each having a first electrode, a light-emitting layer, and a second electrode, and a pixel-defining film defining the pixels. The light-emitting layer may be an organic light-emitting layer including an organic material. In this case, the light-emitting layer may include a hole transport layer, an organic light-emitting layer, and an electron transport layer. In response to a predetermined voltage being applied to the first electrodes of the pixels via the TFTs of the TFT layer TFTL and a cathode voltage being applied to the second electrodes of the pixels, holes and electrons may move to the organic light-emitting layer via the hole transport layer and the electron transport layer, respectively, and may be recombined together in the organic light-emitting layer to emit light. The pixels of the light-emitting element layer EML may be located in the display area DA.

The thin-film encapsulation layer TFEL may be located on the light-emitting element layer EML. The thin-film encapsulation layer TFEL prevents the infiltration of oxygen or moisture into the light-emitting element layer EML. To this end, the thin-film encapsulation layer TFEL may include at least one inorganic film. The inorganic film may include a silicon nitride layer, a silicon oxynitride layer, a silicon oxide layer, or a titanium oxide layer, but the present disclosure is not limited thereto. Also, the thin-film encapsulation layer TFEL protects the light-emitting element layer EML against foreign materials such as dust. To this end, the thin-film encapsulation layer TFEL may include at least one organic film. The organic film may be formed of an acrylic resin, an epoxy resin, a phenolic resin, a polyamide resin, or a PI resin, but the present disclosure is not limited thereto.

The thin-film encapsulation layer TFEL may be located in both the display area DA and the non-display area NDA. For example, the thin-film encapsulation layer TFEL may be arranged to cover the light-emitting element layer EML in the display area DA and the non-display area NDA and to cover the TFT layer TFTL in the non-display area NDA.

The touch sensor layer TSL may be located on the thin-film encapsulation layer TFEL. When the touch sensor layer TSL is located directly on the thin-film encapsulation layer TFEL, the thickness of the display device 10 can be reduced, as compared to when a separate touch panel including the touch sensor layer TSL is attached on the thin-film encapsulation layer TFEL.

The touch sensor layer TSL may include touch electrodes for detecting touch input from a user in a capacitive manner and touch lines for connecting pads and the touch electrodes. For example, the touch sensor layer TSL may detect touch input from the user in a self-capacitance manner or in a mutual capacitance manner.

The touch electrodes of the touch sensor layer TSL may be arranged to overlap with the display area DA. The touch lines of the touch sensor layer TSL may be arranged to overlap with the non-display area NDA.

The cover window 100 may be located on the touch sensor layer TSL, in which case, the touch sensor layer TSL and the cover window 100 may be attached to each other via an adhesive member such as an OCA or an OCR. Alternatively, a polarizing film may be located on the touch sensor layer TSL, in which case, the polarizing film and the cover window 100 may be attached to each other via an adhesive member.

FIG. 5 is a plan view illustrating an example of a display unit of FIG. 4.

For convenience, FIG. 5 illustrates only pixels PX, scan lines SL, data lines DL, scan control lines SCL, routing lines RL, the scan driver 111, the first driving circuit unit 200, and display pads DP of the display unit DU.

Referring to FIG. 5, the scan lines SL, the data lines DL, and the pixels PX are located in the display area DA. The scan lines SL may be formed in parallel in the first direction (or the X-axis direction), and the data lines DL may be formed in parallel in the second direction (or the Y-axis direction).

Figure 20:
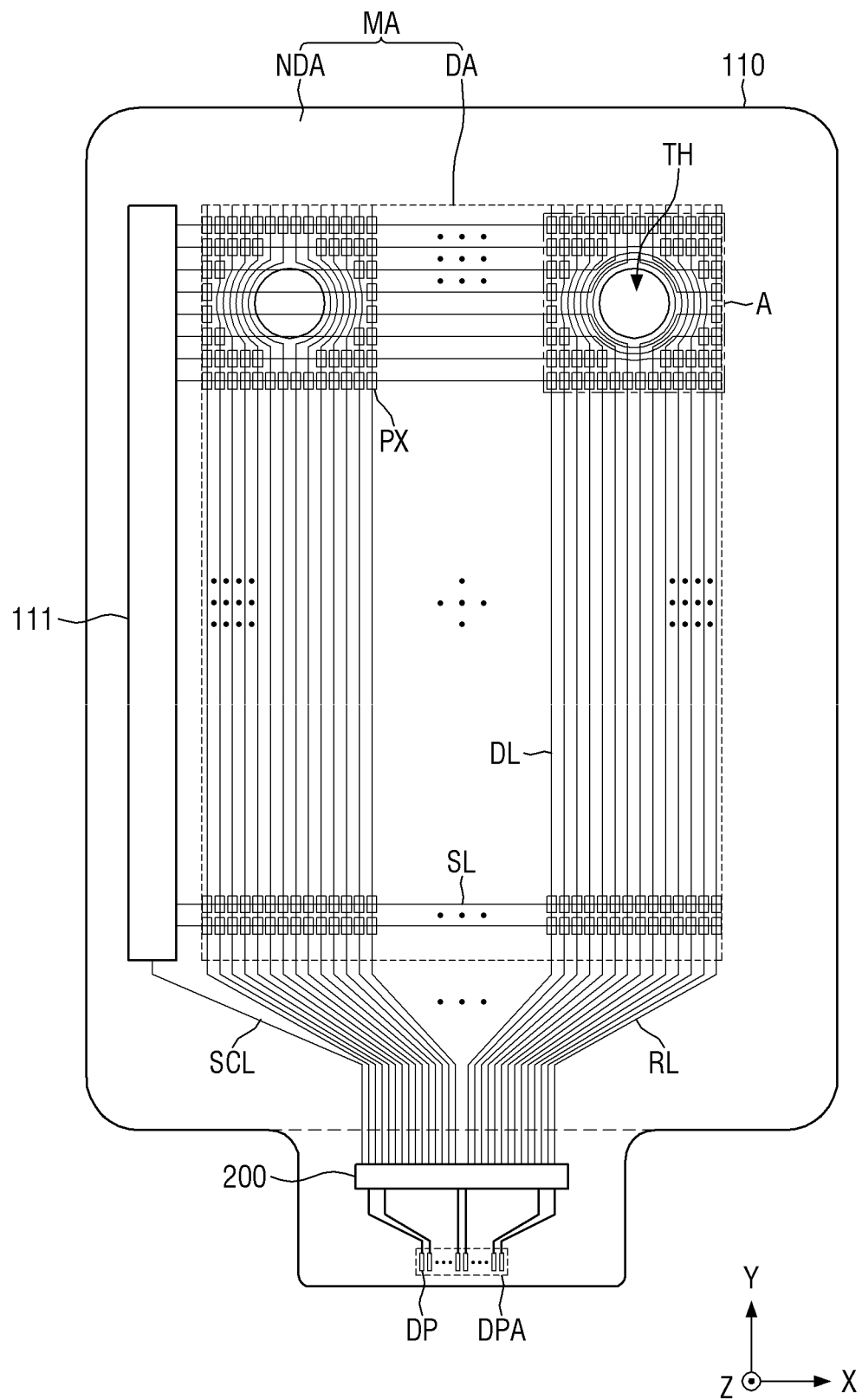
FIG. 20 is a plan view illustrating another example of the display unit of FIG. 4.

The through hole TH, which penetrates the display panel 110, is formed in the display area DA. FIG. 5 illustrates only one through hole TH as being formed in the display area DA, but the present disclosure is not limited thereto. Alternatively, two through holes TH may be formed in the display area DA, as illustrated in FIG. 20, or three or more through holes TH may be formed in the display area DA. Also, FIG. 5 illustrates the through hole TH as having a circular shape in a plan view, but the present disclosure is not limited thereto. Alternatively, the through hole TH may be formed in an elliptical shape, a polygonal shape, or an amorphous shape in a plan view.

The pixels PX, the scan lines SL, and the data lines DL cannot be located in the through hole TH. Thus, because the scan lines SL are formed in the first direction (or the X-axis direction), the scan lines SL may be arranged to bypass the through hole TH to pass through the upper or lower side of the through hole TH and to be connected to pixels PX on the left or right side of the through hole TH. Because the data lines DL are formed in the second direction (or the Y-axis direction), the data lines DL may be arranged to bypass the through hole TH to pass through the left or right side of the through hole TH and to be connected to pixels PX on the upper or lower side of the through hole TH. The relative arrangement of the through hole TH, the pixels PX, the scan lines SL, and the data lines DL will be described later in detail with reference to FIG. 6.

Figure 8A:
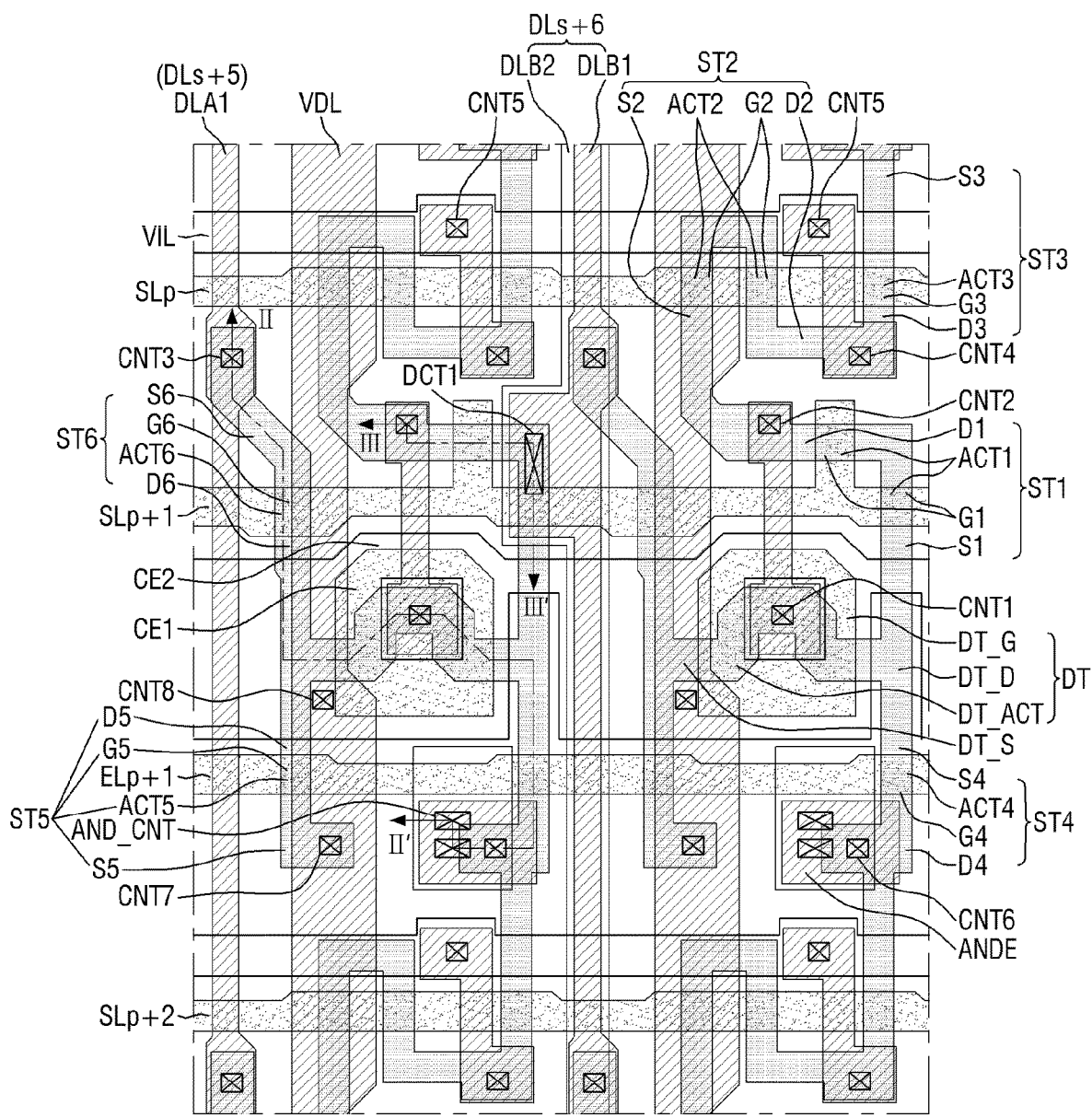
FIG. 8A is a plan view illustrating an example of an area C1 of FIG. 7.

The pixels PX may be located at the intersections between the scan lines SL and the data lines DL. Each of the pixels PX may be connected to at least one of the scan lines SL and one of the data lines DL. FIG. 8A illustrates each of the pixels PX as being connected to three scan lines SL and one data line DL, but the present disclosure is not limited thereto.

Each of the pixels PX may include TFTs (including a driving transistor and one or more switching transistors), an OLED, and a capacitor. In response to scan signals being applied via the scan lines SL by the switching transistors, the pixels PX may receive data voltages via the data lines DL and may emit light by supplying a driving current to the OLEDs thereof in accordance with the data voltages applied to the gate electrodes of the driving transistors thereof. FIG. 8A illustrates each of the pixels PX as including one driving transistor, six switching transistors, an OLED, and a capacitor, but the present disclosure is not limited thereto.

The scan driver 111 may be connected to the first driving circuit unit 200 via at least one scan control line SCL. The scan driver 111 may generate scan signals in accordance with the scan control signals and may provide the scan signals to the scan lines SL. FIG. 5 illustrates the scan driver 111 as being formed in a part of the non-display area NDA on the left side of the display area DA, but the present disclosure is not limited thereto. In another example, the scan driver 111 may be formed in parts of the non-display area NDA on both the left and right sides of the display area DA.

The first driving circuit unit 200 is connected to the display pads DP and thus receives digital video data and timing signals. The first driving circuit unit 200 converts the digital video data into positive/negative analog data voltages and provides the positive/negative analog data voltages to the data lines DL via the routing lines RL. Also, the first driving circuit unit 200 generates scan control signals for controlling the scan driver 111 and provides the scan control signals via the scan control lines SCL. Pixels PX to which data voltages are to be provided may be selected by the scan signals generated by the scan driver 111, and data voltages may be provided to the selected pixels PX. The first driving circuit unit 200 may be formed as an IC and may be attached on the first substrate SUB1 in a COG, COP, or ultrasonic bonding manner.

Figure 6:
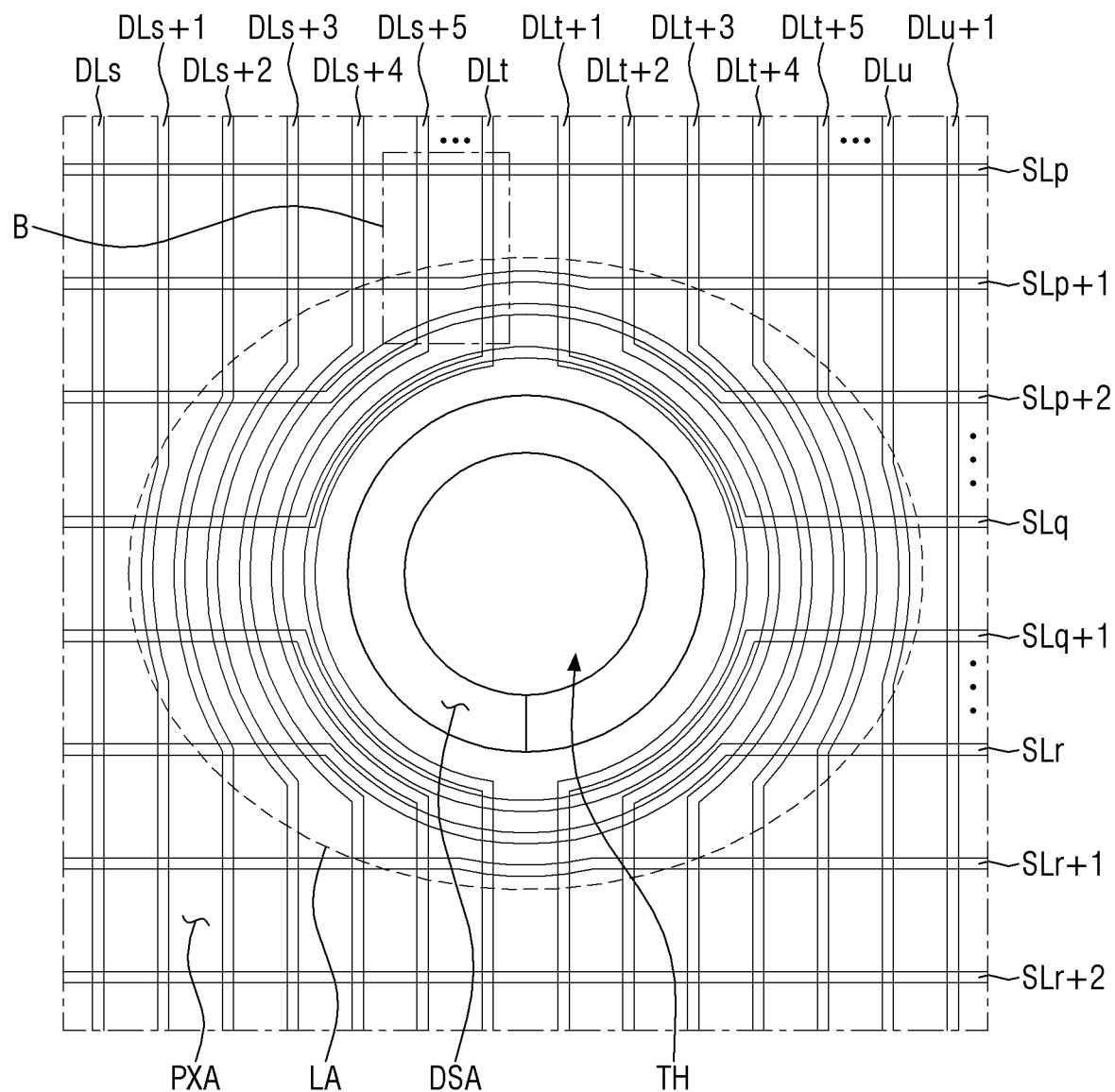
FIG. 6 is a plan view illustrating an area A of FIG. 5.
Figure 7:
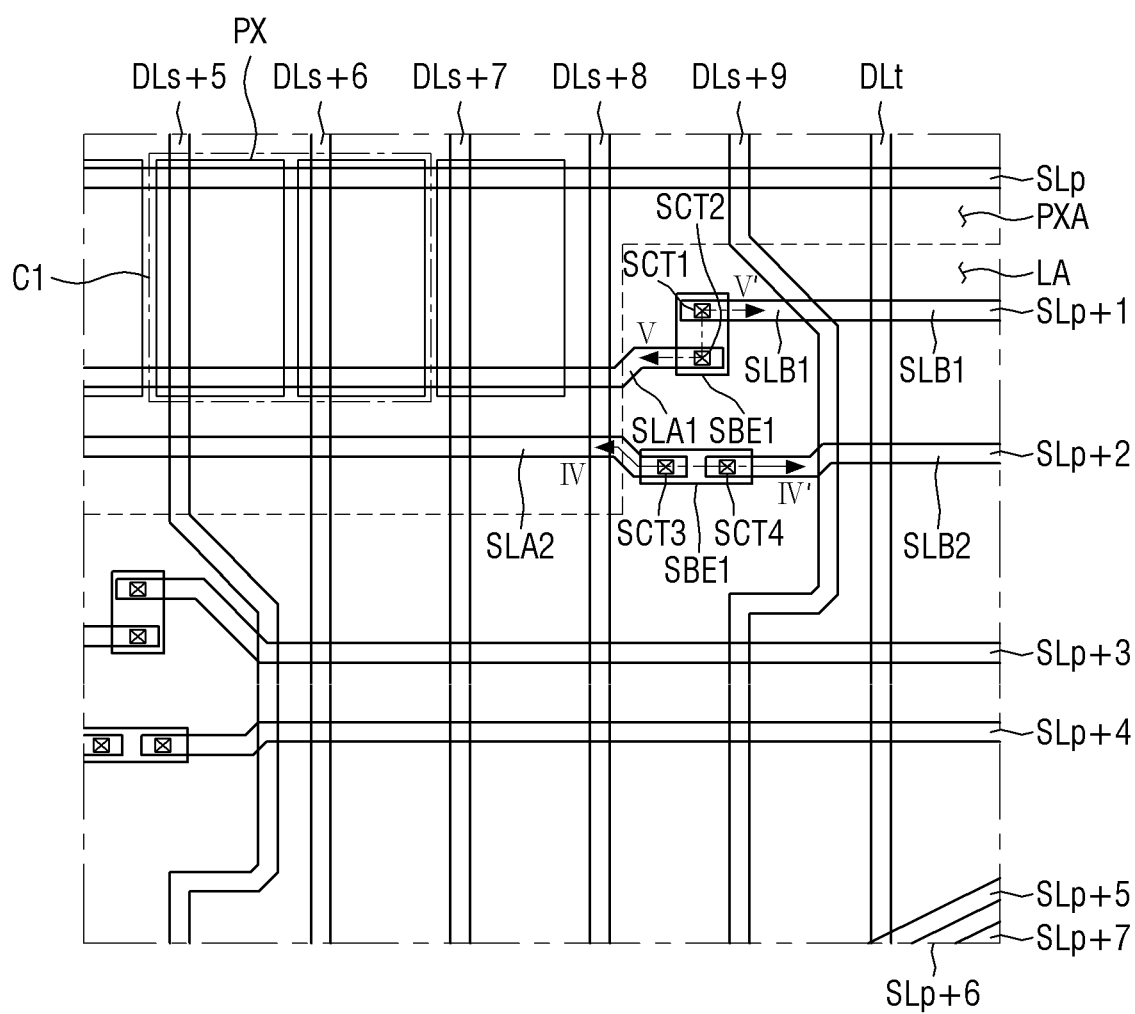
FIG. 7 is a plan view illustrating an area B of FIG. 6.

FIG. 6 is a plan view illustrating an area A of FIG. 5. FIG. 7 is a plan view illustrating an area B of FIG. 6.

For convenience, the pixels PX are not illustrated in FIG. 6, and only p-through (p+7)-th scan lines SLp through SLp+7 and (s+5)- through t-th data lines DLs+5 through DLt are illustrated in FIG. 7.

Referring to FIGS. 6 and 7, the display area DA may include the through hole TH, a dead space area DSA, a wiring area LA, and a pixel area PXA.

The dead space area DSA may be arranged to surround the through hole TH. The pixels PX, the scan lines SL, and the data lines DL may not be located in the dead space area DSA. The dead space area DSA is an area for preventing the through hole TH from encroaching on the wiring area LA due to error in the process of forming the through hole TH.

The wiring area LA may be arranged to surround the dead space area DSA. Because the pixels PX are not located in the wiring area LA, the wiring area LA is classified into the non-display area NDA in which no images are displayed.

In the wiring area LA, the (p+1)- through q-th scan lines SLp+1 through SLq (where p and q are positive integers that satisfy the following inequality: q≥p+3) and the (q+1)- through (r+1)-th scan lines SLq+1 through SLr+1 (where r≥q+2) may be located. The (p+1)- through q-th scan lines SLp+1 through SLq may be bent in the second direction (or the Y-axis direction) and may thus bypass the through hole TH to pass through the upper side of the through hole TH, and the (q+1)- through (r+1)-th scan lines SLq+1 through SLr+1 may be bent in the opposite direction of the second direction (or the opposite direction of the Y-axis direction) and may thus bypass the through hole TH to pass through the lower side of the through hole TH.

In the wiring area LA, the (s+1)- through t-th data lines DLs+1 through DLt (where s and t are positive integers that satisfy the following inequality: t≥s+6) and the (t+1)- through u-th data lines DLt+1 through DLu (where u is a positive integer that satisfies the following inequality: u≥t+6) may be located. The (s+1)- through t-th data lines DLs+1 through DLt may be bent in the opposite direction of the first direction (or the opposite direction of the X-axis direction) and may thus bypass the through hole TH to pass through the left side of the through hole TH, and the (t+1)- through u-th data lines DLt+1 through DLu may be bent in the first direction (or the X-axis direction) and may thus bypass the through hole TH to pass through the right side of the through hole TH.

In the wiring area LA, the (p+1)- through q-th scan lines SLp+1 through SLq and the (q+1)- through (r+1)-th scan lines SLq+1 through SLr+1 may intersect the (s+1)- through t-th data lines DLs+1 through DLt and the (t+1)- through u-th data lines DLt+1 through DLu. The distances between the (p+1)- through q-th scan lines SLp+1 through SLq and between the (q+1)- through (r+1)-th scan lines SLq+1 through SLr+1 may be smaller in the wiring area LA than in the pixel area PXA.

The pixel area PXA refers to an area in which the pixels PX are located. In the pixel area PXA, the scan lines SL may be arranged to extend in parallel in the first direction (or the X-axis direction), and the data lines DL may be arranged to extend in parallel in the second direction (or the Y-axis direction).

Each of the pixels PX may overlap with at least one of the scan lines SL and one of the data lines DL. FIG. 8A illustrates each of the pixels PX as being connected to three scan lines SL and one data line DL, but the present disclosure is not limited thereto.

In order to minimize the size of the wiring area LA, the distances between the (s+1)- through t-th data lines DLs+1 through DLt and between the (t+1)- through u-th data lines DLt+1 through DLu may be set to be smaller in the wiring area LA than in the pixel area PXA. Also, in order to minimize the size of the wiring area LA, each pair of adjacent scan lines SL may be located in different metal layers in the wiring area LA, whereas they are located in the same gate layer in the pixel area PXA.

For example, the (p+1)-th scan line SLp+1 may include 1A- and 1B-th scan lines SLA1 and SLB1, which are located in the same gate layer, and a first scan bridge electrode SBE1. The first scan bridge electrode SBE1 may be connected to the 1A-th scan line SLA1 through a first scan contact hole SCT1, which exposes the 1A-th scan line SLA1, and may be connected to the 1B-th scan line SLB1 through a second scan contact hole SCT2, which exposes the 1B-th scan line SLB1. The 1A-th scan line SLA1 may be a scan line connected to the pixels PX, and the 1B-th scan line SLB1 may be a scan line bypassing the through hole TH in the wiring area LA.

The (p+2)-th scan line SLp+2, which is adjacent to the (p+1)-th scan line SLp+1, may include 2A- and 2B-th scan lines SLA2 and SLB2, which are located in different gate layers, and a second scan bridge electrode SBE2. The second scan bridge electrode SBE2 may be connected to the 2A-th scan line SLA2 through a third scan contact hole SCT3, which exposes the 2A-th scan line SLA2, and may be connected to the 2B-th scan line SLB2 through a fourth scan contact hole SCT4, which exposes the 2B-th scan line SLB2. The 2A-th scan line SLA2 may be a scan line connected to the pixels PX, and the 2B-th scan line SLB2 may be a scan line bypassing the through hole TH in the wiring area LA.

In the embodiment of FIGS. 6 and 7, the (p+1)-th scan line SLp+1, which includes the 1A- and 1B-th scan lines SLA1 and SLB1 that are located in the same gate layer, and the (p+2)-th scan line SLp+2, which includes the 2A- and 2B-th scan lines SLA2 and SLB2 that are located in different metal layers, both include a scan bridge electrode. Thus, any difference in wiring resistance between the (p+1)- and (p+2)-th scan lines SLp+1 and SLp+2 can be minimized. That is, any difference in RC time constant between the (p+1)- and (p+2)-th scan lines SLp+1 and SLp+2 can be minimized.

Figure 9:
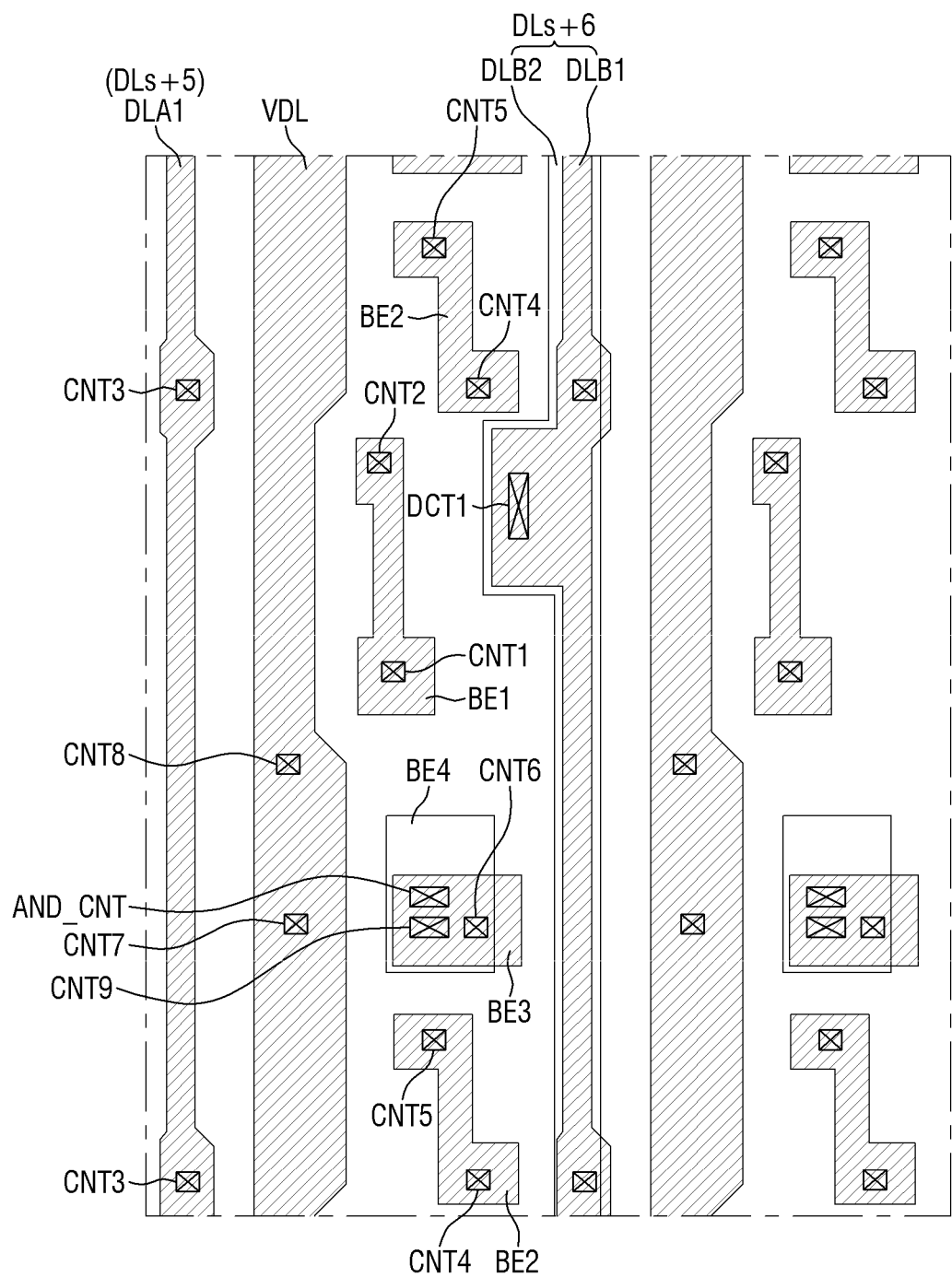
FIG. 9 is a plan view illustrating first and second data metal layers of FIG. 8A.

FIG. 8A is a plan view illustrating an example of an area C1 of FIG. 7. FIG. 9 is a plan view illustrating first and second data metal layers of FIG. 8A.

FIGS. 8A and 9 illustrate each of the pixels PX as including seven transistors and one capacitor, but the present disclosure is not limited thereto.

Referring to FIGS. 8A and 9, each of the pixels PX may include a driving transistor DT, first through sixth switching transistors ST1 through ST6, and a capacitor C1.

The driving transistor DT may include a driving active layer DT_ACT, a driving gate electrode DT_G, a driving source electrode DT_S, and a driving drain electrode DT_D. The driving active layer DT_ACT may overlap with the driving gate electrode DT_G. The driving source electrode DT_S may be connected to a sixth drain electrode D6 of the sixth switching transistor ST6. The driving drain electrode DT_D may be connected to source electrodes S1 and S4 of the first and fourth switching transistors ST1 and ST4.

The first switching transistor ST1 may include a first active layer ACT1, a first gate electrode G1, a first source electrode S1, and a first drain electrode D1. The first gate electrode G1 may be a part of the (p+1)-th scan line SLp+1 that overlaps with the first active layer ACT1. The first source electrode S1 may be connected to the drain electrode DT_D of the driving transistor DT. The first drain electrode D1 may be connected to the gate electrode DT_G of the driving transistor DT. The first switching transistor ST1 may be formed as a dual transistor. In this case, the first switching transistor ST1 may include two first active layers ACT1 and two first gate electrodes G1, as illustrated in FIG. 8A.

The second switching transistor ST2 may include a second active layer ACT2, a second gate electrode G2, a second source electrode S2, and a second drain electrode D2. The second gate electrode G2 may be a part of the p-th scan line SLp that overlaps with the second active layer ACT2. The second source electrode S2 may be connected to the gate electrode DT_G of the driving transistor DT and the first drain electrode D1 of the first switching transistor ST1. The second drain electrode D2 may be connected to an initialization voltage line VIL through a fourth contact hole CNT4. The second switching transistor ST2 may be formed as a dual transistor. In this case, the second switching transistor ST2 may include two second active layers ACT2 and two second gate electrodes G2, as illustrated in FIG. 8A.

The third switching transistor ST3 may include a third active layer ACT3, a third gate electrode G3, a third source electrode S3, and a third drain electrode D3. The third gate electrode G3 may be a part of the (p)-th scan line SLp that overlaps with the third active layer ACT3. The third source electrode S3 may be connected to an anode electrode AND of an OLED. The third drain electrode D3 may be connected to the initialization voltage line VIL through a fourth contact hole CNT4.

The fourth switching transistor ST4 may include a fourth active layer ACT4, a fourth gate electrode G4, a fourth source electrode S4, and a fourth drain electrode D4. The fourth gate electrode G4 may be a part of a (p+1)-th emission control line ELp+1 that overlaps with the fourth active layer ACT4. The fourth source electrode S4 may be connected to the drain electrode DT_D of the driving transistor DT and the first source electrode S1 of the first switching transistor ST1. The fourth drain electrode D4 may be connected to the anode electrode AND of the OLED.

The fifth switching transistor ST5 may include a fifth active layer ACT5, a fifth gate electrode G5, a fifth source electrode S5, and a fifth drain electrode D5. The fifth gate electrode G5 may be a part of the (p+1)-th emission control line ELp+1 that overlaps with the fifth active layer ACT5. The fifth drain electrode D5 may be connected to the source electrode DT_S of the driving transistor DT and the sixth drain electrode D6 of the sixth switching transistor ST6. The fifth source electrode S5 may be connected to a first power supply voltage line VDL through a seventh contact hole CNT7.

The sixth switching transistor ST6 may include a sixth active layer ACT6, a sixth gate electrode G6, a sixth source electrode S6, and a sixth drain electrode D6. The sixth gate electrode G6 may be a part of the (p+1)-th scan line SLp+1 that overlaps with the sixth active layer ACT6. The sixth source electrode S6 may be connected to a data line through a third contact hole CNT3. The sixth drain electrode D6 may be connected to the driving source electrode DT_S of the driving transistor DT.

A first electrode CE1 of the capacitor C1 may be substantially the same as the gate electrode DT_G of the driving transistor DT, and a second electrode CE2 of the capacitor C1 may overlap with the gate electrode DT_G of the driving transistor DT and may be connected to the first power supply voltage line VDL through an eighth contact hole CNT8.

A first bridge electrode BE1 may be connected to the driving gate electrode DT_G through a first contact hole CNT1. The first bridge electrode BE1 may be connected to the first drain electrode D1 of the first switching transistor ST1 through a second contact hole CNT2.

A second bridge electrode BE2 may be connected to the second drain electrode D2 of the second switching transistor ST2 through a fourth contact hole CNT4. The second bridge electrode BE2 may be connected to the initialization voltage line VIL through a fifth contact hole CNT5. The second bridge electrode BE2 may be arranged to intersect the p-th scan line SLp.

A third bridge electrode BE3 may be connected to the fourth drain electrode D4 of the fourth switching transistor ST4 through a sixth contact hole CNT6. The third bridge electrode BE3 may be connected to a fourth bridge electrode BE4 through a ninth contact hole CNT9. The fourth bridge electrode BE4 may be connected to the anode electrode AND through an anode contact hole AND_CNT.

The (s+5)-th data line DLs+5 may include a 1A-th data line DLA1, and the (s+6)-th data line DLs+6, which is adjacent to the (s+5)-th data line DLs+5, may include 1B- and 2B-th data lines DLB1 and DLB2. The 2B-th data line DLB2 may be connected to the 1B-th data line DLB1 through a first data contact hole DCT1.

The 1A-th data line DLA1, the 1B-th data line DLB1, the first power supply voltage line VDL, the first bridge electrode BE1, the second bridge electrode BE2, and the third bridge electrode BE3 may be formed as a first data layer. On the other hand, the 2B-th data line DLB2 and the fourth bridge electrode BE4 may be formed as a second data layer, which is located in a different layer from the first data layer.

The (s+5)-th data line DLs+5 may include only the 1A-th data line DLA1 in both the pixel area PXA and the wiring area LA. The (s+6)-th data line DLs+6 may include the 1B- and 2B-th data lines DLB1 and DLB2 in the pixel area PXA, but may include only the 2B-th data line DLB2 in the wiring area LA. In order to minimize the size of the wiring area LA, the distance between the (s+5)- and (s+6)-th data lines DLs+5 and DLs+6 may be set to be smaller in the wiring area LA than in the pixel area PXA. Also, in the wiring area LA, the (s+5)- and (s+6)-th data lines DLs+5 and DLs+6 may be arranged to overlap with each other.

The pixels PX may include a first pixel outputting first light, a second pixel outputting second light, and a third pixel outputting third light. For example, the first pixel may be a red pixel outputting red light, the second pixel may be a green pixel outputting green light, and the third pixel may be a blue pixel outputting blue light. In this example, the (s+5)-th data line DLs+5 may be connected to at least one of the first, second, and third pixels, and the (s+6)-th data line DLs+6 may be connected to at least one of the first, second, and third pixels, but not to the same pixel as the (s+5)-th data line DLs+5. For example, the (s+5)-th data line DLs+5 may be connected to the first and third pixels, and the (s+6)-th data line DLs+6 may be connected to the second pixel.

Because the (s+5)-th data line DLs+5 includes only the 1A-th data line DLA1, but the (s+6)-th data line DLs+6 includes both the 1B- and 2B-th data lines DLB1 and DLB2, the wiring resistance of the (s+5)-th data line DLs+5 may differ from the wiring resistance of the (s+6)-th data line DLs+6. That is, the RC time constant of the (s+5)-th data line DLs+5 may differ from the RC time constant of the (s+6)-th data line DLs+6. However, the first and third pixels are connected to the (s+5)-th data line DLs+5, whereas the second pixel is connected to the (s+6)-th data line DLs+6. Thus, the luminances of the pixels PX can be prevented from varying depending on any difference in wiring resistance between the data lines DL.

FIGS. 8A and 9 illustrate that the (s+5)-th data line DLs+5 includes only the 1A-th data line DLA1, and that the (s+6)-th data line DLs+6 includes both the 1B- and 2B-th data lines DLB1 and DLB2, but the present disclosure is not limited thereto. Alternatively, each odd-numbered data line may include the 1A-th data line DLA1, and each even-numbered data line may include both the 1B- and 2B-th data lines DLB1 and DLB2.

In the embodiment of FIGS. 8A and 9, between a pair of adjacent data lines, a first data line includes only the 1A-th data line DLA1, which is located in the first data layer, and a second data line includes both the 1B- and 2B-th data lines DLB1 and DLB2, which are located in the first and second data layer, respectively. Particularly, in the wiring area LA, the second data line includes only the 2B-th data line DLB2. Thus, the first and second data lines do not need any bridge electrodes in the wiring area LA. Accordingly, the load of the first and second data lines can be prevented from increasing due to the presence of bridge electrodes. Also, any difference between the load of the first and second data lines that pass through the wiring area LA and the load of data lines that do not pass through the wiring area LA can be minimized. Here, the first and second data lines may be the (s+5)- and (s+6)-th data lines DLs+5 and DLs+6, respectively.

Figure 8B:
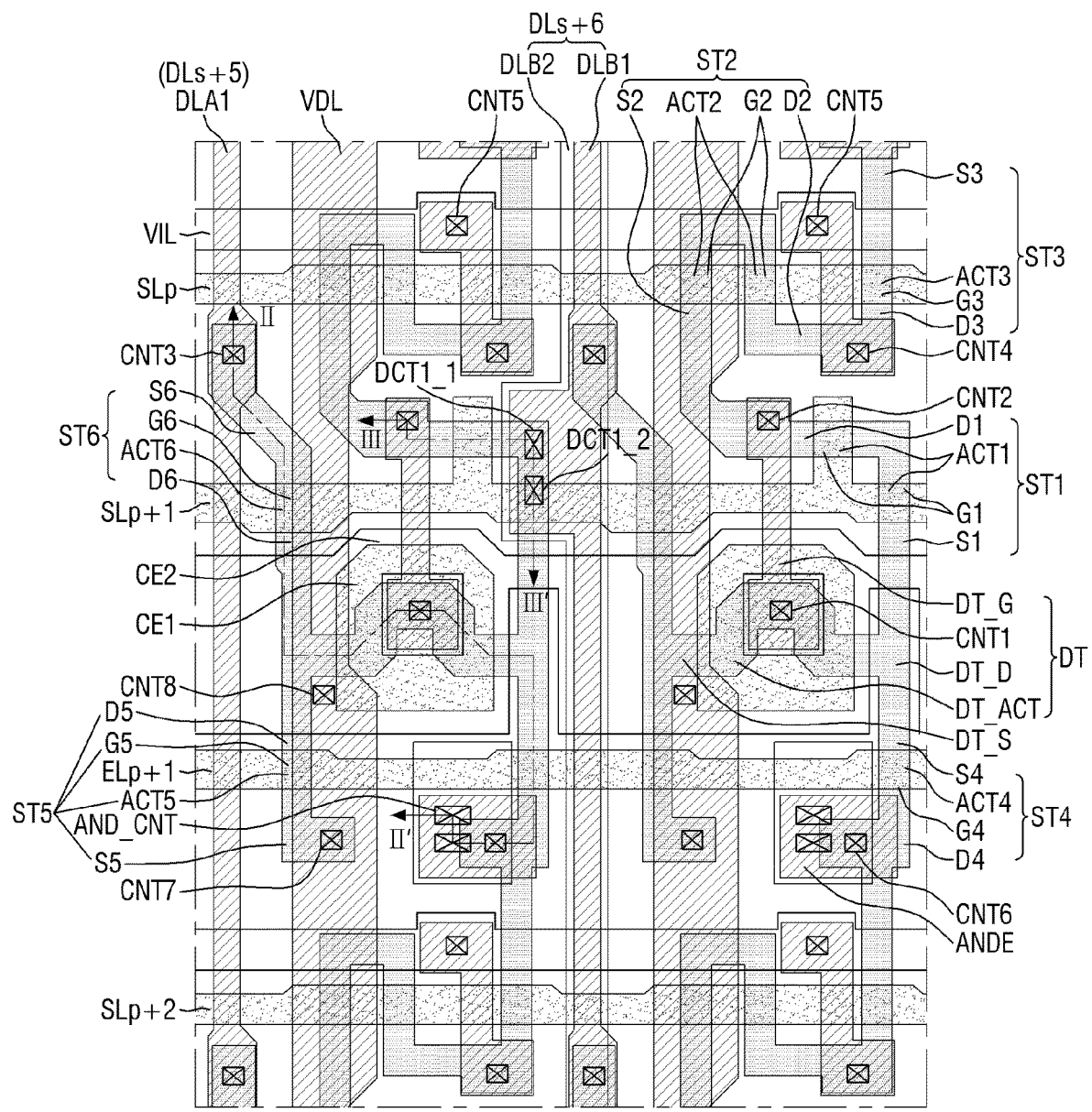
FIG. 8B is a plan view illustrating another example of the area C1 of FIG. 7.

FIG. 8A illustrates that the 2B-th data line DLB2 is connected to the 1B-th data line DLB1 through a single first data contact hole DCT1, but the present disclosure is not limited thereto. Alternatively, as illustrated in FIG. 8B, the 2B-th data line DLB2 may be connected to the 1B-th data line DLB1 through a plurality of first data contact holes (DCT1_1 and DCT1_2). In this case, at least one of the plurality of first data contact holes (DCT1_1 and DCT1_2) may be arranged to overlap with at least one of the first gate electrode G1, the first active layer ACT1, the first source electrode S1, and the first drain electrode D1 of the first switching transistor ST1. FIG. 8B illustrates that a "1_2"-th data contact hole DCT1_2, among first data contact holes (DCT1_1 and DCT1_2), overlaps with the first gate electrode G1 and the first active layer ACT1 of the first switching transistor ST1.

Figure 10:
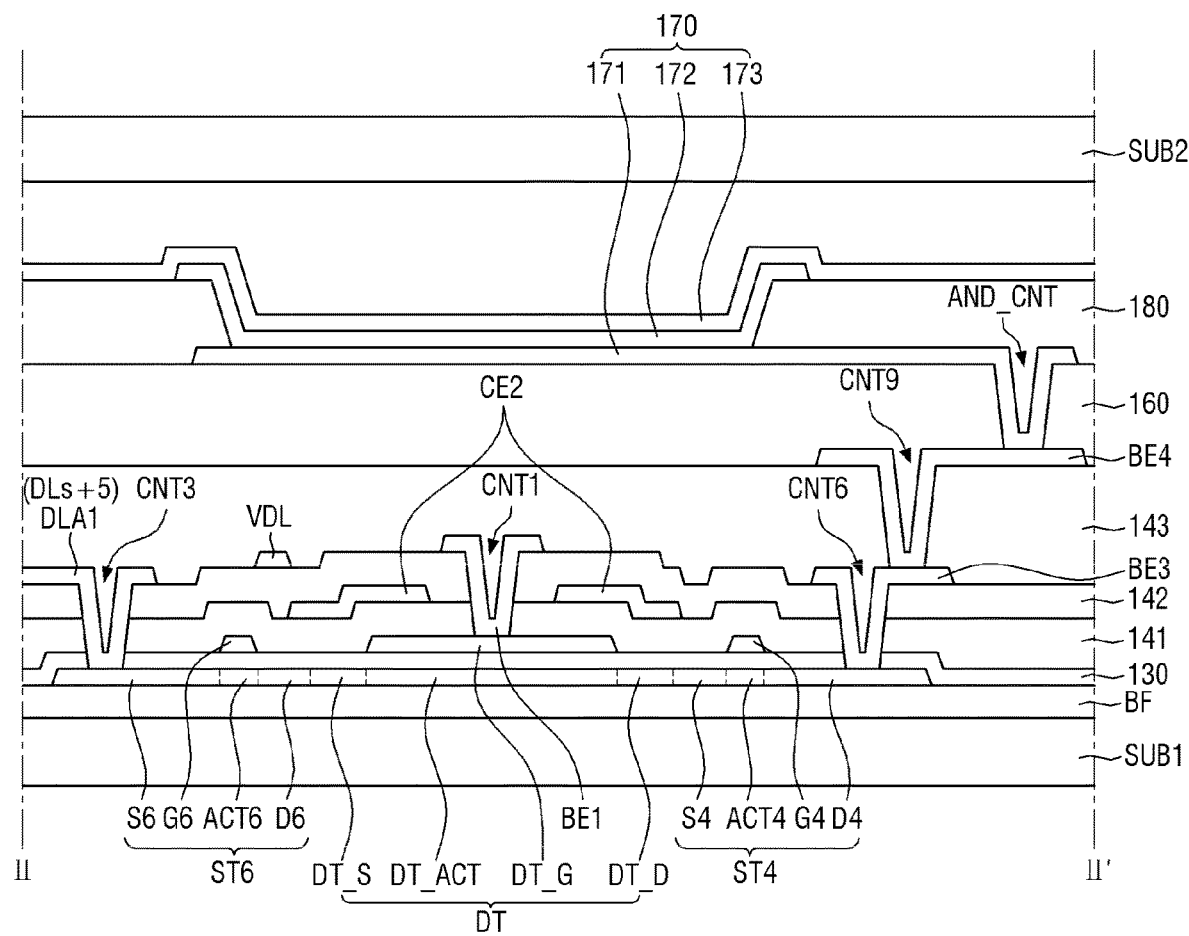
FIG. 10 is a cross-sectional view taken along the line II-II' of FIG. 8A.
Figure 11:
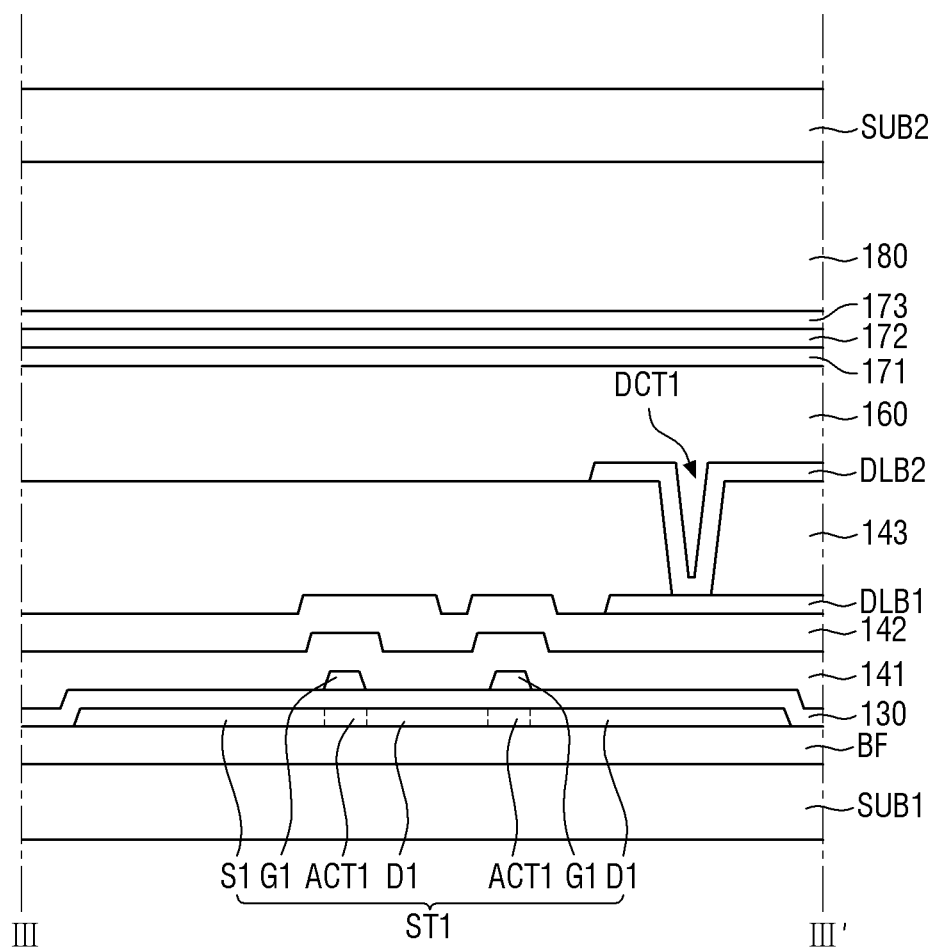
FIG. 11 is a cross-sectional view taken along the line III-III' of FIG. 8A.
Figure 12:
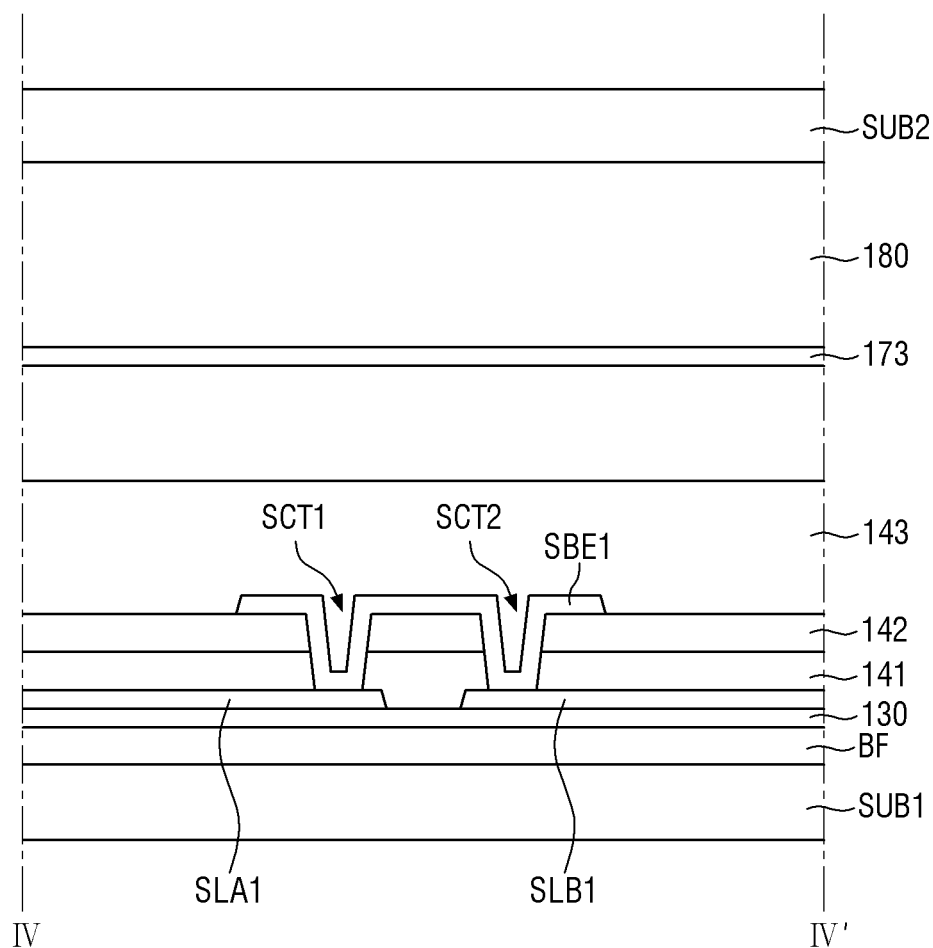
FIG. 12 is a cross-sectional view taken along the line IV-IV' of FIG. 7.
Figure 13:
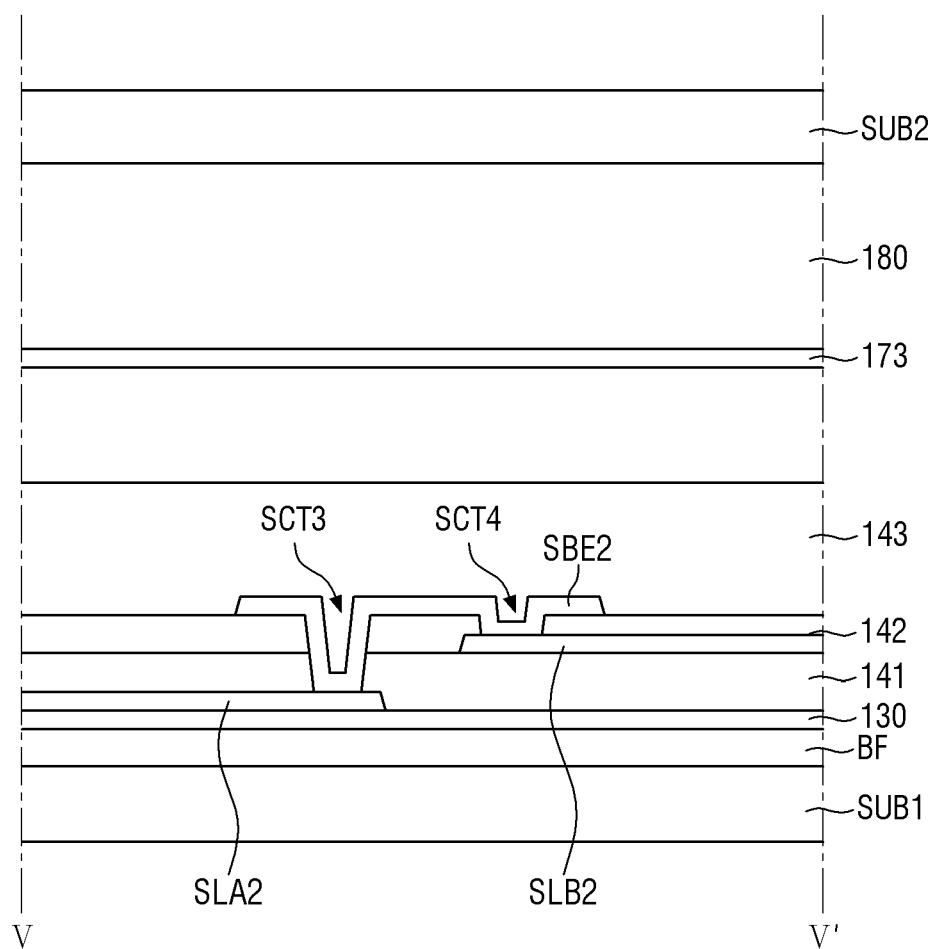
FIG. 13 is a cross-sectional view taken along the line V-V' of FIG. 7.

FIG. 10 is a cross-sectional view taken along line II-II' of FIG. 8A. FIG. 11 is a cross-sectional view taken along line III-III' of FIG. 8A. FIG. 12 is a cross-sectional view taken along line IV-IV' of FIG. 7. FIG. 13 is a cross-sectional view taken along line V-V' of FIG. 7.

Referring to FIGS. 10 through 13, the TFT layer TFTL and the light-emitting element layer EML are formed on the first substrate SUB1. The TFT layer TFTL includes an active layer ACT, a first gate layer GTL1, a second gate layer GTL2, a first data metal layer DTL1, a second data metal layer DTL2, a gate insulating film 130, a first interlayer insulating film 141, a second interlayer insulating film 142, a third interlayer insulating film 143, and a planarization film 160.

A buffer film BF may be formed on the first substrate SUB1. The buffer film BF may be formed on the first substrate SUB1 to protect TFTs and an organic light-emitting layer 172 of the light-emitting element layer EML against moisture that may penetrate the TFTs and the organic light-emitting layer 172 through the first substrate SUB1. The buffer film BF may include a plurality of inorganic films that are alternately stacked. For example, the buffer film BF may be formed as a multilayer film in which at least one of a silicon nitride layer, a silicon oxynitride layer, a silicon oxide layer, a titanium oxide layer, and an aluminum oxide layer is alternately stacked. The buffer film BF may not be provided.

The active layer ACT may be formed on the first substrate SUB1 or on the buffer film BF. The active layer ACT may include polycrystalline silicon, monocrystalline silicon, low-temperature polycrystalline silicon, amorphous silicon, or an oxide semiconductor. A light-shielding layer, which is for blocking external light incident upon the active layer ACT, may be formed below the active layer ACT.

In a case where the active layer ACT is formed of polycrystalline silicon, the active layer ACT may have conductivity. The active layer ACT may include not only the active layers (DT_ACT and ACT1 through ACT6) of the driving transistor DT and the first through sixth switching transistors ST1 through ST6, but also the source electrodes (DT_S and S1 through S6) and the drain electrodes (DT_G and D1 through D6) of the driving transistor DT and the first through sixth switching transistors ST1 through ST6.

The gate insulating film 130 may be formed on the active layer ACT. The gate insulating film 130 may be formed as an inorganic film such as, for example, a silicon nitride layer, a silicon oxynitride layer, a silicon oxide layer, a titanium oxide layer, or an aluminum oxide layer.

The first gate layer GTL1 may be formed on the gate insulating film 130. The first gate layer GTL1 may include the gate electrodes (DT_G and G1 through G6) of the driving transistor DT and the first through sixth switching transistors ST1 through ST6, the scan lines SL, emission control lines EL, the 1A- and 1B-th scan lines SLA1 and SLB1 of the (p+1)-th scan line SLp+1, and the 2A-th scan line SLA2 of the (p+2)-th scan line SLp+2. The first gate layer GTL1 may be formed as a single- or multilayer film including molybdenum (Mo), aluminum (Al), chromium (Cr), gold (Au), titanium (Ti), nickel (Ni), neodymium (Nd), copper (Cu), or an alloy thereof.

The first interlayer insulating film 141 may be formed on the first gate layer GTL1. The first interlayer insulating film 141 may be formed as an inorganic film such as, for example, a silicon nitride layer, a silicon oxynitride layer, a silicon oxide layer, a titanium oxide layer, or an aluminum oxide layer. The first interlayer insulating film 141 may include a plurality of inorganic films.

The second gate layer GTL2 may be formed on the first interlayer insulating film 141. The second gate layer GTL2 may include the initialization voltage line VIL, the second electrode CE2 of the capacitor C1, and the 2B-th scan line SLB2 of the (p+2)-th scan line SLp+2. The second gate layer GTL2 may be formed as a single- or multilayer film including Mo, Al, Cr, Au, Ti, Ni, Nd, Cu, or an alloy thereof.

The second interlayer insulating film 142 may be formed on the second gate layer GTL2. The second interlayer insulating film 142 may be formed as an inorganic film such as, for example, a silicon nitride layer, a silicon oxynitride layer, a silicon oxide layer, a titanium oxide layer, or an aluminum oxide layer. The second interlayer insulating film 142 may include a plurality of inorganic films.

The first data metal layer DTL1 may be formed on the second interlayer insulating film 142. The first data metal layer DTL1 may include the 1A-th data line DLA1 of the (s+5)-th data line DLs+5, the 1B-th data line DLB1 of the (s+6)-th data line DLs+6, the first power supply voltage line VDL, the first bridge electrode BE1, the second bridge electrode BE2, the third bridge electrode BE3, the first scan bridge electrode SBE1, and the second scan bridge electrode SBE2. The first data metal layer DTL1 may be formed as a single- or multilayer film including Mo, Al, Cr, Au, Ti, Ni, Nd, Cu, or an alloy thereof.

The first bridge electrode BE1 may be connected to the driving gate electrode DT_G of the driving transistor DT through the first contact hole CNT1, which penetrates the first and second interlayer insulating films 141 and 142. The 1A-th data line DLA1 of the (s+5)-th data line DLs+5 may be connected to the sixth source electrode S6 of the sixth switching transistor ST6 through the third contact hole CNT3, which penetrates the gate insulating film 130, the first interlayer insulating film 141, and the second interlayer insulating film 142. The third bridge electrode BE3 may be connected to the fourth drain electrode D4 of the fourth switching transistor ST4 through the sixth contact hole CNT6, which penetrates the gate insulating film 130, the first interlayer insulating film 141, and the second interlayer insulating film 142.

The first scan bridge electrode SBE1 may be connected to the 1A-th scan line SLA1 through the first scan contact hole SCT1, which penetrates the first and second interlayer insulating films 141 and 142. Also, the first scan bridge electrode SBE1 may be connected to the 1B-th scan line SLB1 through the second scan contact hole SCT2, which penetrates the first and second interlayer insulating films 141 and 142.

The second scan bridge electrode SBE2 may be connected to the 2A-th scan line SLA2 through the third scan contact hole SCT3, which penetrates the first and second interlayer insulating films 141 and 142. Also, the second scan bridge electrode SBE2 may be connected to the 2B-th scan line SLB2 through the fourth scan contact hole SCT4, which penetrates the second interlayer insulating film 142.

A third interlayer insulating film 143 may be formed on the first data metal layer DTL1. The third interlayer insulating film 143 may be formed as an inorganic film such as, for example, a silicon nitride layer, a silicon oxynitride layer, a silicon oxide layer, a titanium oxide layer, or an aluminum oxide layer. The third interlayer insulating film 143 may include a plurality of inorganic films. The third interlayer insulating film 143 may be thicker than the first and second interlayer insulating films 141 and 142.

The second data metal layer DTL2 may be formed on the third interlayer insulating film 143. The second data metal layer DTL2 may include the 2B-th data line DLB2 of the (s+6)-th data line DLs+6 and the fourth bridge electrode BE4. The second data metal layer DTL2 may be formed as a single- or multilayer film including Mo, Al, Cr, Au, Ti, Ni, Nd, Cu, or an alloy thereof.

The 2B-th data line DLB2 of the (s+6)-th data line DLs+6 may be connected to the 1B-th data line DLB1 through the first data contact hole DCT1, which penetrates the third interlayer insulating film 143. The first data contact hole DCT1 may be arranged to overlap with at least one of the first gate electrode G1, the first active layer ACT1, the first source electrode S1, and the first drain electrode D1 of the first switching transistor ST1. That is, the first data contact hole DCT1, to which the 1B- and 2B-th data lines DLB1 and DLB2 of the (s+6)-th data line DLs+6 are connected, may be arranged to overlap with at least one of the first gate electrode G1, the first active layer ACT1, the first source electrode S1, and the first drain electrode D1 of the first switching transistor ST1 of each pixel PX connected to the (s+5)-th data line DLs+5 that is adjacent to the (s+6)-th data line DLs+6.

The fourth bridge electrode BE4 may be connected to the third bridge electrode BE3 through the ninth contact hole CNT9, which penetrates the third interlayer insulating film 143.

The planarization film 160 may be formed to planarize height differences formed by the active layer ACT, the first gate layer GTL1, the second gate layer GTL2, the first data metal layer DTL1, and the second data metal layer DTL2. The planarization film 160 may be formed as an organic film including an acrylic resin, an epoxy resin, a phenolic resin, a polyamide resin, or a PI resin.

FIGS. 10 and 11 illustrate the driving transistor DT and the first, fourth, and sixth switching transistors ST1, ST4, and ST6 as having a top gate structure in which the driving gate electrodes DT_G and the first, fourth, and sixth gate electrodes G1, G4, and G6 are located above the driving active layer DT_ACT and the first, fourth, and sixth active layers ACT1, ACT4, and ACT6, respectively, but the present disclosure is not limited thereto. Alternatively, the driving transistor DT and the first, fourth, and sixth switching transistors ST1, ST4, and ST6 may be configured to have a bottom gate structure in which the driving gate electrodes DT_G and the first, fourth, and sixth gate electrodes G1, G4, and G6 are located below the driving active layer DT_ACT and the first, fourth, and sixth active layers ACT1, ACT4, and ACT6, respectively, or a double gate structure in which the driving gate electrodes DT_G and the first, fourth, and sixth gate electrodes G1, G4, and G6 are located not only above, but also below, the driving active layer DT_ACT and the first, fourth, and sixth active layers ACT1, ACT4, and ACT6, respectively.

The second, third, and fifth switching transistors ST2, ST3, and ST5 are substantially the same as the first, fourth, and sixth switching transistors ST1, ST4, and ST6 of FIGS. 10 and 11, and thus, detailed descriptions thereof will be omitted.

The light-emitting element layer EML is formed on the TFT layer TFTL. The light-emitting element layer EML includes a light-emitting element 170 and a pixel-defining film 180.

The light-emitting element 170 and the pixel-defining film 180 are formed on the planarization film 160. The light-emitting element 170 may include a first electrode 171, an organic light-emitting layer 172, and a second electrode 173.

The first electrode 171 may be formed on the planarization film 160. The first electrode 171 may be connected to the fourth bridge electrode BE4 via a contact hole AND_CNT that penetrates the planarization film 160.

In a case where the light-emitting element 170 has a top emission structure and emits light in a direction from the organic light-emitting layer 172 to the second electrode 173, the first electrode 171 may be formed of a metal material with high reflectance such as a stack of Al and Ti (e.g., Ti/Al/Ti), a stack of Al and ITO (e.g., ITO/Al/ITO), a silver (Ag)-palladium (Pd)-copper (Cu) (APC) alloy, or a stack of an APC alloy and ITO (e.g., ITO/APC/ITO).

The pixel-defining film 180 may be formed to define the first electrode 171 on a planarization film 160 and thus to define the light-emitting area of each of the pixels PX. The pixel-defining film 180 may be formed to cover the edges of each of the first electrode 171. The pixel-defining film 180 may be formed as an organic film including an acrylic resin, an epoxy resin, a phenolic resin, a polyamide resin, or a PI resin.

The light-emitting area of each of the pixels PX may be defined as a region in which the first electrode 171, the organic light-emitting layer 172, and the second electrode 173 are sequentially stacked so that holes from the first electrode 171 and electrons from the second electrode 173 can be recombined together in the organic light-emitting layer 172 to emit light. Each of the pixels PX may include a red subpixel emitting red light, a green subpixel emitting green light, and a blue subpixel emitting blue light.

The organic light-emitting layer 172 is formed on the first electrode 171 and on the pixel-defining film 180. The organic light-emitting layer 172 may include an organic material and may thus emit light of a predetermined color. For example, the organic light-emitting layer 172 may include a hole transport layer, an organic material layer, and an electron transport layer. In this example, the organic light-emitting layer 172 of the red subpixel of each of the pixels PX may emit red light, the organic light-emitting layer 172 of the green subpixel of each of the pixels PX may emit green light, and the organic light-emitting layer 172 of the blue subpixel of each of the pixels PX may emit blue light. In another example, the organic light-emitting layer 172 of each of the pixels PX may emit white light, in which case, the red, green, and blue subpixels of each of the pixels PX may overlap with red, green, and blue color filter layers, respectively.

The second electrode 173 is formed on the organic light-emitting layer 172 and the pixel-defining film 180. The second electrode 173 may be formed to cover the organic light-emitting layer 172. The second electrode 173 may be a common layer formed in common for all the pixels PX. A capping layer may be formed on the second electrode 173.

In a case where the light-emitting element 170 has a top emission structure, the second electrode 173 may be formed of a transparent metal material capable of transmitting light therethrough, such as indium tin oxide (ITO) or indium zinc oxide (IZO), or a semitransparent metal material such as the alloy of magnesium (Mg) and Ag. When the second electrode 173 is formed of a semitransparent metal material, the emission efficiency of the light-emitting element 170 may be improved due to micro-cavities.

A second substrate SUB2 is located on the light-emitting element layer EML. The space between the light-emitting element layer EML and the second substrate SUB2 may be filled with a vacuum. Alternatively, a filling film may be located between the light-emitting element layer EML and the second substrate SUB2, in which case, the filling film may be an epoxy filling film or a silicon filling film. Still alternatively, an encapsulation film may be formed between the light-emitting element layer EML and the second substrate SUB2. The encapsulation film may include at least one inorganic film to prevent the infiltration of oxygen or moisture into the light-emitting element layer EML or may include at least one organic film to protect the light-emitting element layer EML against foreign materials such as dust.

Figure 14:
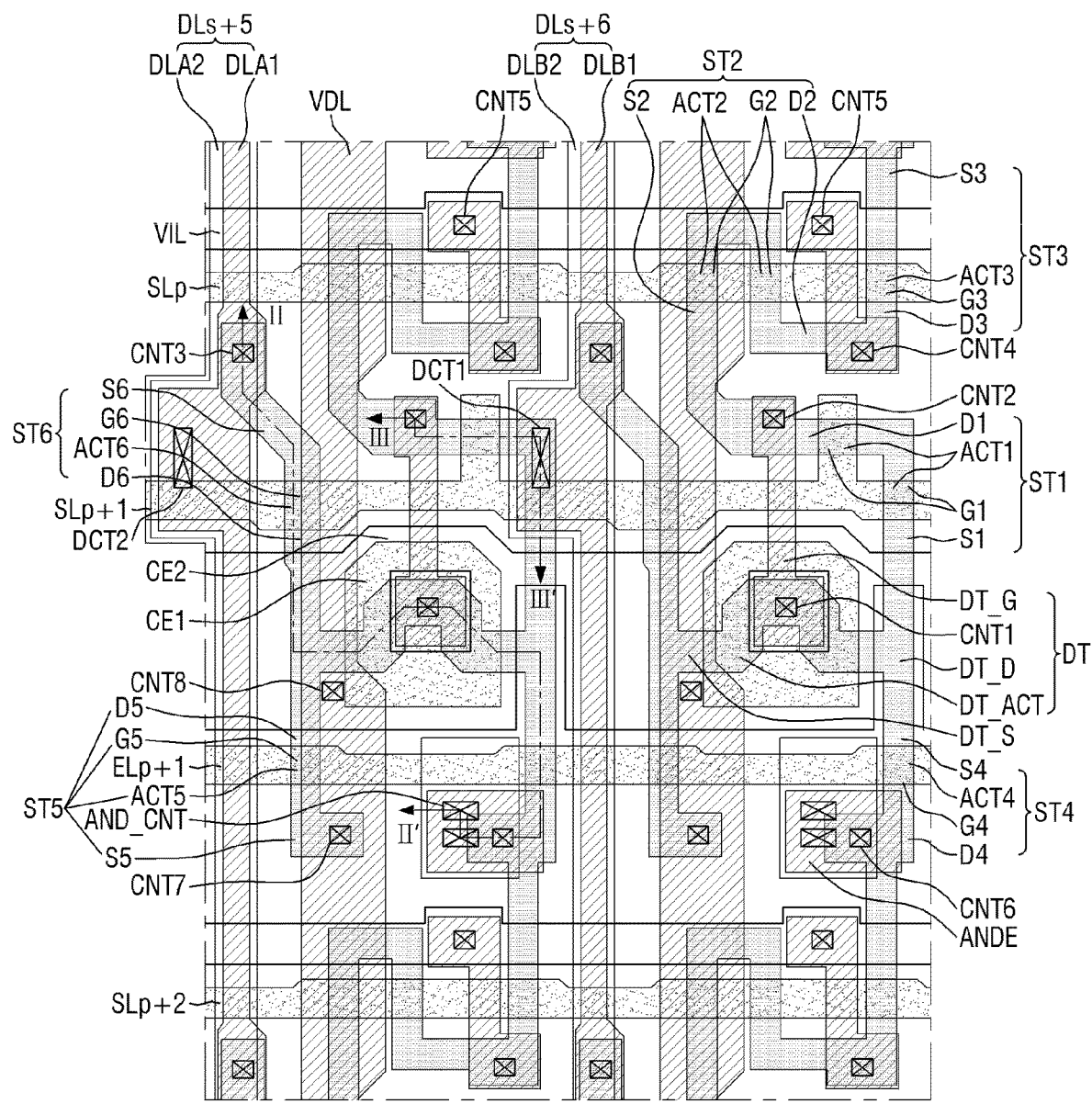
FIG. 14 is a plan view illustrating another example of the area C1 of FIG. 7.
Figure 15:
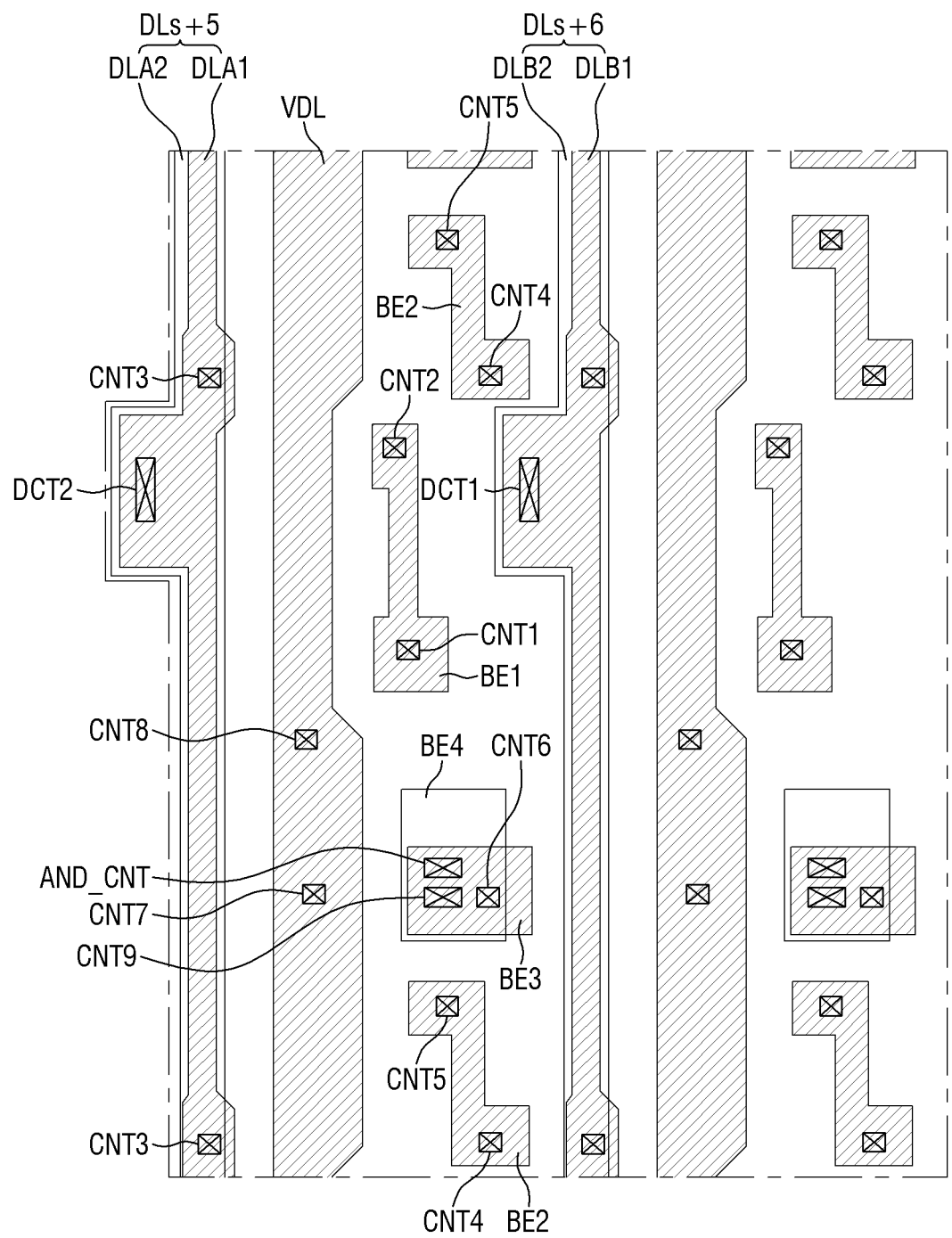
FIG. 15 is a plan view illustrating first and second data metal layers of FIG. 14.

FIG. 14 is a plan view illustrating another example of the area C1 of FIG. 7. FIG. 15 is a plan view illustrating first and second data metal layers of FIG. 14.

The embodiment of FIGS. 14 and 15 differs from the embodiment of FIGS. 8A and 9 in that the (s+5)-th data line DLs+5 includes not only the 1A-th data line DLA1, but also the 2A-th data line DLA2. The embodiment of FIGS. 14 and 15 will hereinafter be described, focusing mainly on the differences with the embodiment of FIGS. 8A and 9.

Referring to FIGS. 14 and 15, the (s+5)-th data line DLs+5 includes the 1A- and 2A-th data lines DLA1 and DLA2, and the (s+6)-th data line DLs+6, which is adjacent to the (s+5)-th data line DLs+5, includes the 1B- and 2B-th data lines DLB1 and DLB2. The 2A-th data line DLA2 may be connected to the 1A-th data line DLA1 through a second data contact hole DCT2. The 2B-th data line DLB2 may be connected to the 1B-th data line DLB1 through the first data contact hole DCT1.

The 1A-th data line DLA1, the 1B-th data line DLB1, the first power supply voltage line VDL, the first bridge electrode BE1, the second bridge electrode BE2, and the third bridge electrode BE3 may be formed as a first data layer. On the other hand, the 2A-th data line DLA2, the 2B-th data line DLB2, and the fourth bridge electrode BE4 may be formed as a second data layer.

The (s+5)-th data line DLs+5 includes both the 1A- and 2A-th data lines DLA1 and DLA2 in the pixel area PXA, but includes only the 1A-th data line DLA1 in the wiring area LA. The (s+6)-th data line DLs+6 includes the 1B- and 2B-th data lines DLB1 and DLB2 in the pixel area PXA, but includes only the 2B-th data line DLB2 in the wiring area LA. In order to minimize the size of the wiring area LA, the distance between the (s+5)- and (s+6)-th data lines DLs+5 and DLs+6 may be set to be smaller in the wiring area LA than in the pixel area PXA. Also, in the wiring area LA, the (s+5)- and (s+6)-th data lines DLs+5 and DLs+6 may be arranged to overlap with each other.

Because the (s+5)-th data line DLs+5 includes both the 1A- and 2A-th data lines DLA1 and DLA2 and the (s+6)-th data line DLs+6 includes both the 1B- and 2B-th data lines DLB1 and DLB2, any difference in wiring resistance between the (s+5)- and (s+6)-th data lines DLs+5 and DLs+6 can be minimized. That is, any difference in RC time constant between the (s+5)- and (s+6)-th data lines DLs+5 and DLs+6 can be minimized.

FIGS. 14 and 15 illustrate that the (s+5)-th data line DLs+5 includes both the 1A- and 2A-th data lines DLA1 and DLA2, and that the (s+6)-th data line DLs+6 includes both the 1B- and 2B-th data lines DLB1 and DLB2, but the present disclosure is not limited thereto. Alternatively, each odd-numbered data line may include the 1A- and 2A-th data lines DLA1 and DLA2, and each even-numbered data line may include both the 1B- and 2B-th data lines DLB1 and DLB2.

In the embodiment of FIGS. 14 and 15, between a pair of adjacent data lines, a first data line includes both the 1A- and 2A-th data lines DLA1 and DLA2, which are located in the first and second data layer respectively, and a second data line includes both the 1B- and 2B-th data lines DLB1 and DLB2, which are located in the second data layer. Particularly, in the wiring area LA, the first data line includes only the 1A-th data line DLA1, and the second data line includes only the 2B-th data line DLB2. Thus, the first and second data lines do not need any bridge electrodes in the wiring area LA. Accordingly, the load of the first and second data lines can be prevented from increasing due to the presence of bridge electrodes. Also, any difference between the load of the first and second data lines that pass through the wiring area LA and the load of data lines that do not pass through the wiring area LA can be minimized. Here, the first and second data lines may be the (s+5)- and (s+6)-th data lines DLs+5 and DLs+6, respectively.

FIG. 14 illustrates that the 2B-th data line DLB2 is connected to the 1B-th data line DLB1 through a single first data contact hole DCT1, and that the 2A-th data line DLA2 is connected to the 1A_th data line DLA1 through a single second data contact hole DCT2, but the present disclosure is not limited thereto. Alternatively, as illustrated in FIG. 8B, the 2B-th data line DLB2 may be connected to the 1B-th data line DLB1 through a plurality of first data contact holes (DCT1_1 and DCT1_2). Similarly, the 2A-th data line DLA2 may be connected to the 1A_th data line DLA1 through a plurality of second data contact holes DCT2. In this case, at least one of the plurality of first data contact holes (DCT1_1 and DCT1_2) may be arranged to overlap with at least one of the first gate electrode G1, the first active layer ACT1, the first source electrode S1, and the first drain electrode D1 of the first switching transistor ST1, and at least one of the plurality of second data contact holes DCT2 may also be arranged to overlap with at least one of the first gate electrode G1, the first active layer ACT1, the first source electrode S1, and the first drain electrode D1 of the first switching transistor ST1.

Figure 16:
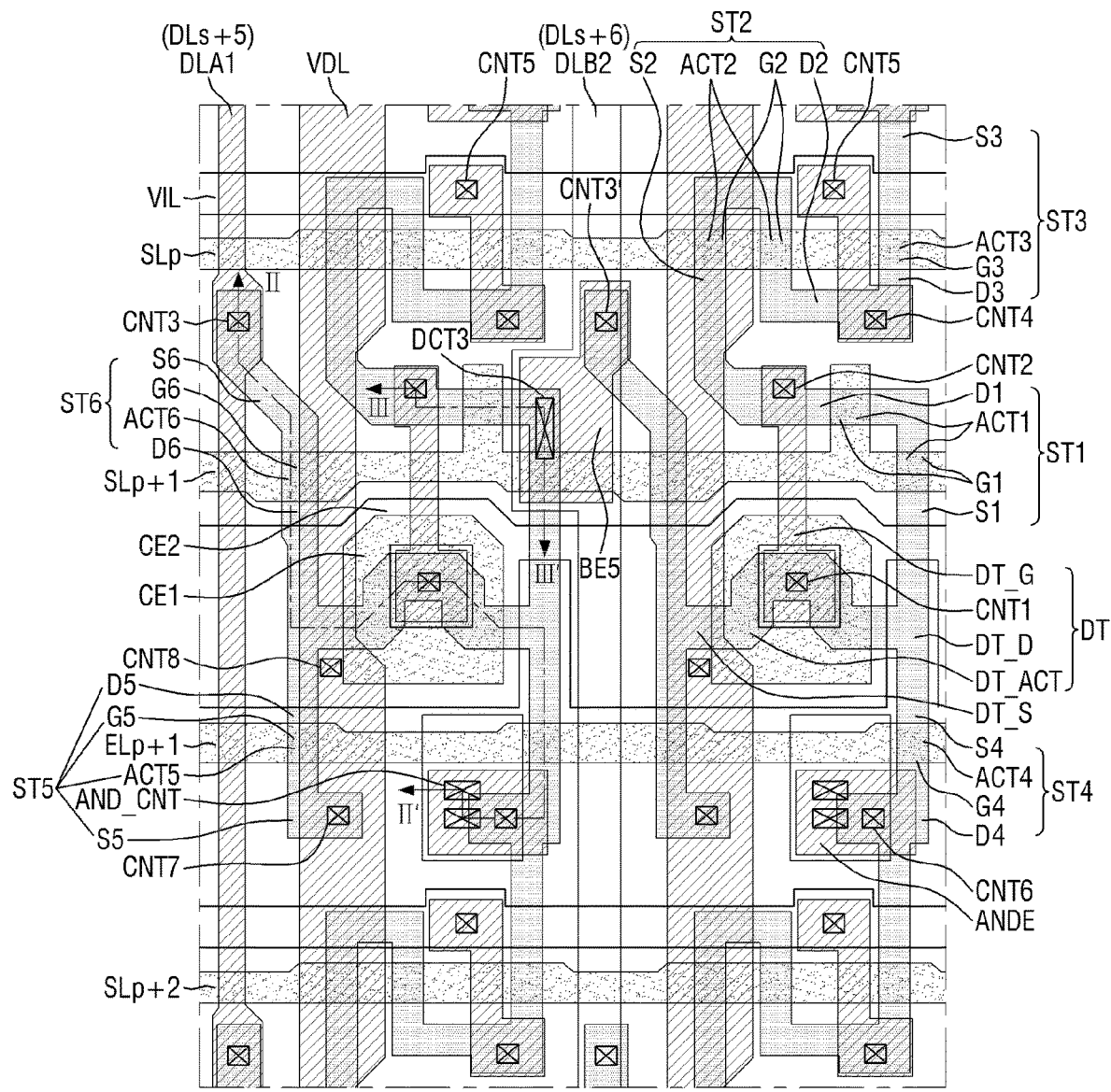
FIG. 16 is a plan view illustrating another example of the area C1 of FIG. 7.
Figure 17:
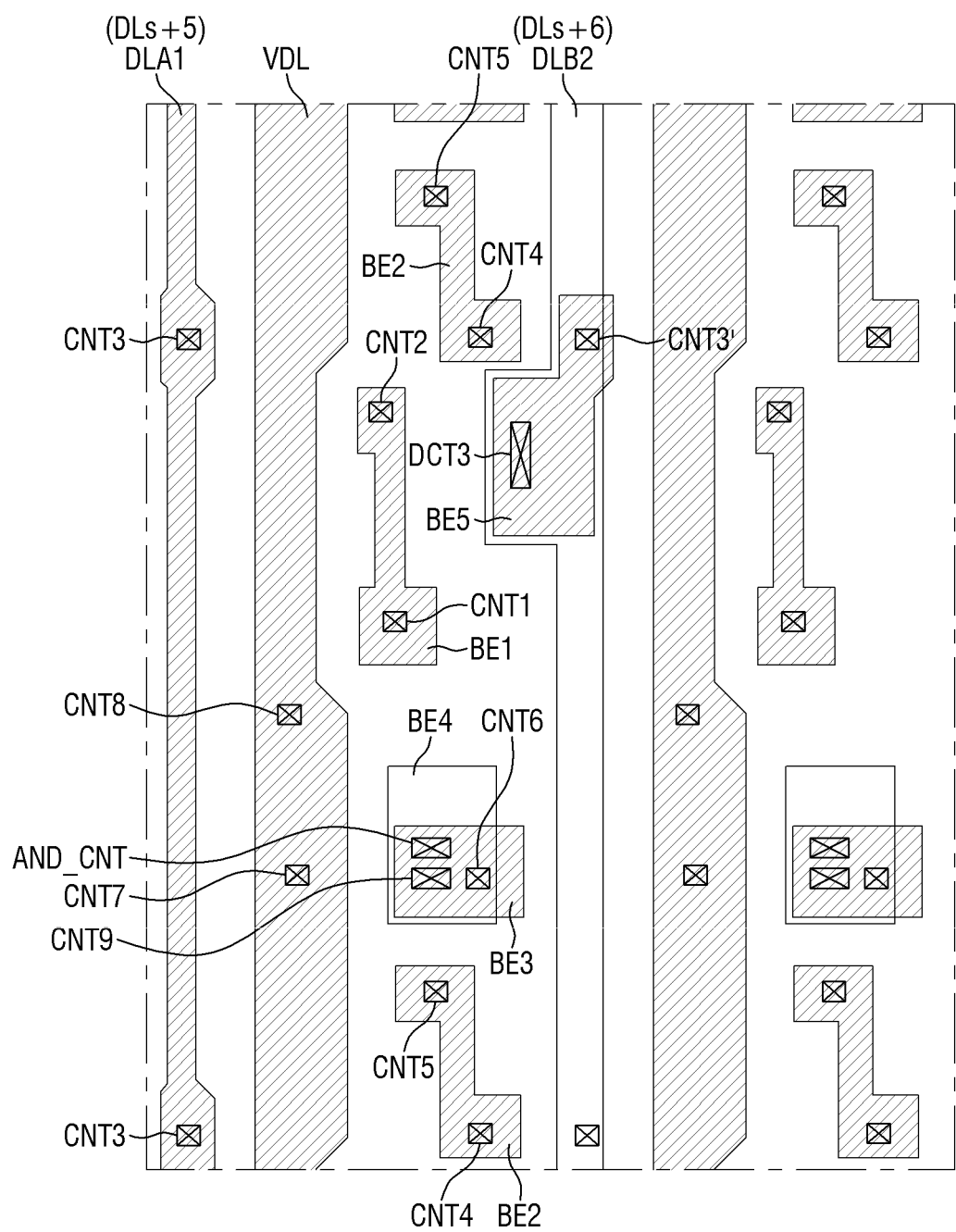
FIG. 17 is a plan view illustrating first and second data metal layers of FIG. 16.

FIG. 16 is a plan view illustrating another example of the area C1 of FIG. 7. FIG. 17 is a plan view illustrating first and second data metal layers of FIG. 16.

The embodiment of FIGS. 16 and 17 differs from the embodiment of FIGS. 8A and 9 in that the (s+6)-th data line DLs+6 includes only the 2B-th data line DLB2. The embodiment of FIGS. 16 and 17 will hereinafter be described, focusing mainly on the differences with the embodiment of FIGS. 8A and 9.

Referring to FIGS. 16 and 17, the (s+5)-th data line DLs+5 includes only the 1A-th data line DLA1, and the (s+6)-th data line DLs+6, which is adjacent to the (s+5)-th data line DLs+5, includes only the 2B-th data line DLB2. In this case, the 2B-th data line DLB2 may be connected to a first data bridge electrode BE5 through a third data contact hole DCT3, and the first data bridge electrode BE5 may be connected to the sixth source electrode S6 of the sixth switching transistor ST6 through a third contact hole CNT3'.

The 1A-th data line DLA1, the first power supply voltage line VDL, the first bridge electrode BE1, the second bridge electrode BE2, the third bridge electrode BE3, and the first data bridge electrode BE5 may be formed as a first data layer. On the other hand, the 2B-th data line DLB2 and the fourth bridge electrode BE4 may be formed as a second data layer, which is located in a different layer from the first data layer.

The (s+5)-th data line DLs+5 includes only the 1A-th data line DLA1 in both the pixel area PXA and the wiring area LA. The (s+6)-th data line DLs+6 includes only the 2B-th data line DLB2 in both the pixel area PXA and the wiring area LA. In order to minimize the size of the wiring area LA, the distance between the (s+5)- and (s+6)-th data lines DLs+5 and DLs+6 may be set to be smaller in the wiring area LA than in the pixel area PXA. Also, in the wiring area LA, the (s+5)- and (s+6)-th data lines DLs+5 and DLs+6 may be arranged to overlap with each other.

Because the (s+5)-th data line DLs+5 includes the 1A-th data line DLA1 and the (s+6)-th data line DLs+6 includes the 2B-th data line DLB2, any difference in wiring resistance between the (s+5)- and (s+6)-th data lines DLs+5 and DLs+6 can be minimized. That is, any difference in RC time constant between the (s+5)- and (s+6)-th data lines DLs+5 and DLs+6 can be minimized.

FIGS. 16 and 17 illustrate the (s+5)-th data line DLs+5 includes the 1A-th data line DLA1, and that the (s+6)-th data line DLs+6 includes the 2B-th data line DLB2, but the present disclosure is not limited thereto. Alternatively, each odd-numbered data line may include the 1A-th data line DLA1, and each even-numbered data line may include the 2B-th data line DLB2.

In the embodiment of FIGS. 16 and 17, between a pair of adjacent data lines, a first data line includes the 1A-th data line DLA1, which is located in the first data layer, and a second data line includes the 2B-th data line DLB2, which is located in the second data layer. Thus, the first and second data lines do not need any bridge electrodes in the wiring area LA. Accordingly, the load of the first and second data lines can be prevented from increasing due to the presence of bridge electrodes. Also, any difference between the load of the first and second data lines that pass through the wiring area LA and the load of data lines that do not pass through the wiring area LA can be minimized. Here, the first and second data lines may be the (s+5)- and (s+6)-th data lines DLs+5 and DLs+6, respectively.

FIG. 16 illustrates that the first data bridge electrode BE5 is connected to the 2B-th data line DLB2 through a single third data contact hole DCT3, but the present disclosure is not limited thereto. Alternatively, the first data bridge electrode BE5 may be connected to the 2B-th data line DLB2 through a plurality of third data contact holes DCT3. In this case, at least one of the plurality of third data contact holes DCT3 may be arranged to overlap with at least one of the first gate electrode G1, the first active layer ACT1, the first source electrode S1, and the first drain electrode D1 of the first switching transistor ST1.

Figure 18:
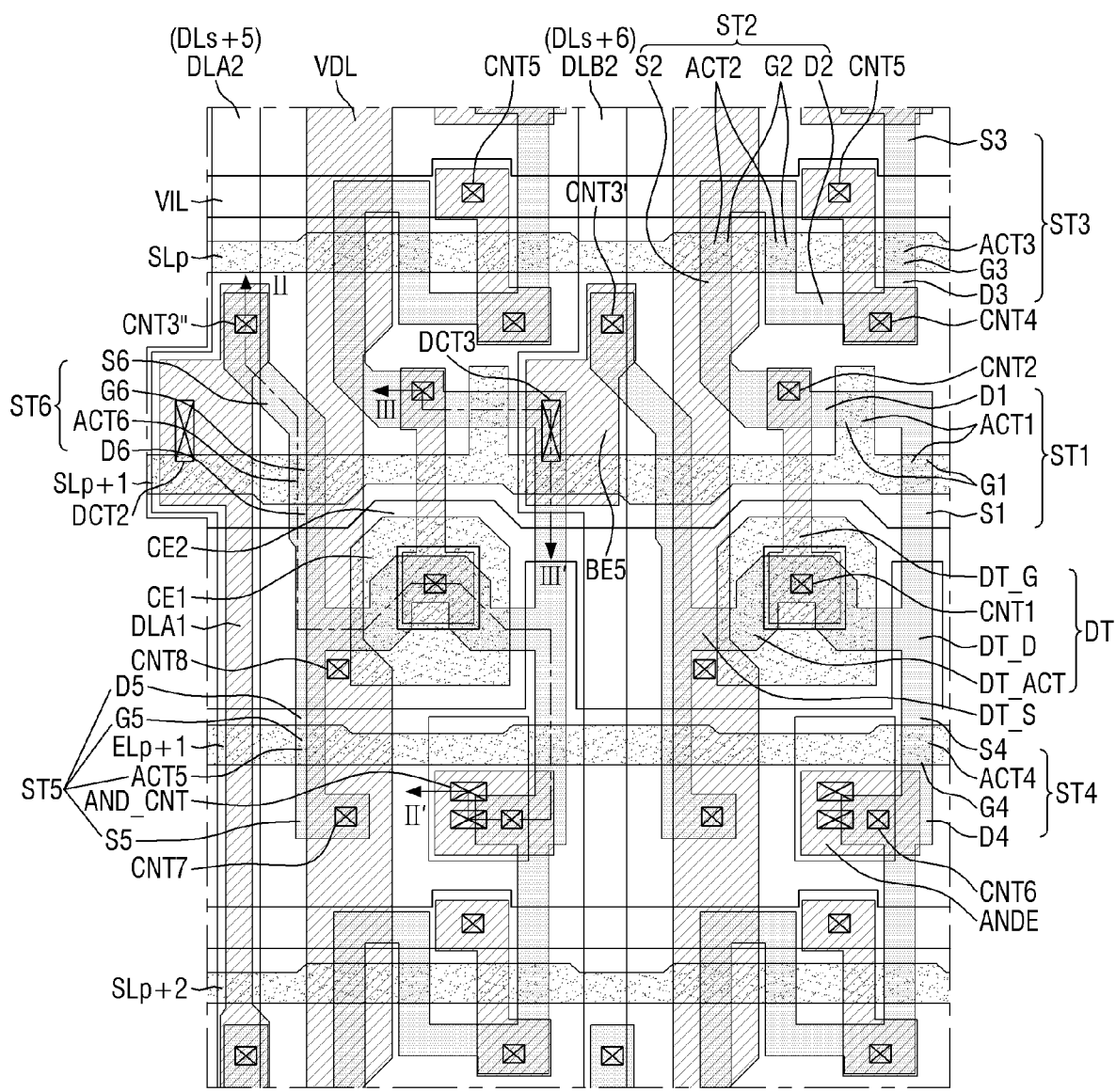
FIG. 18 is a plan view illustrating another example of the area C1 of FIG. 7.
Figure 19:
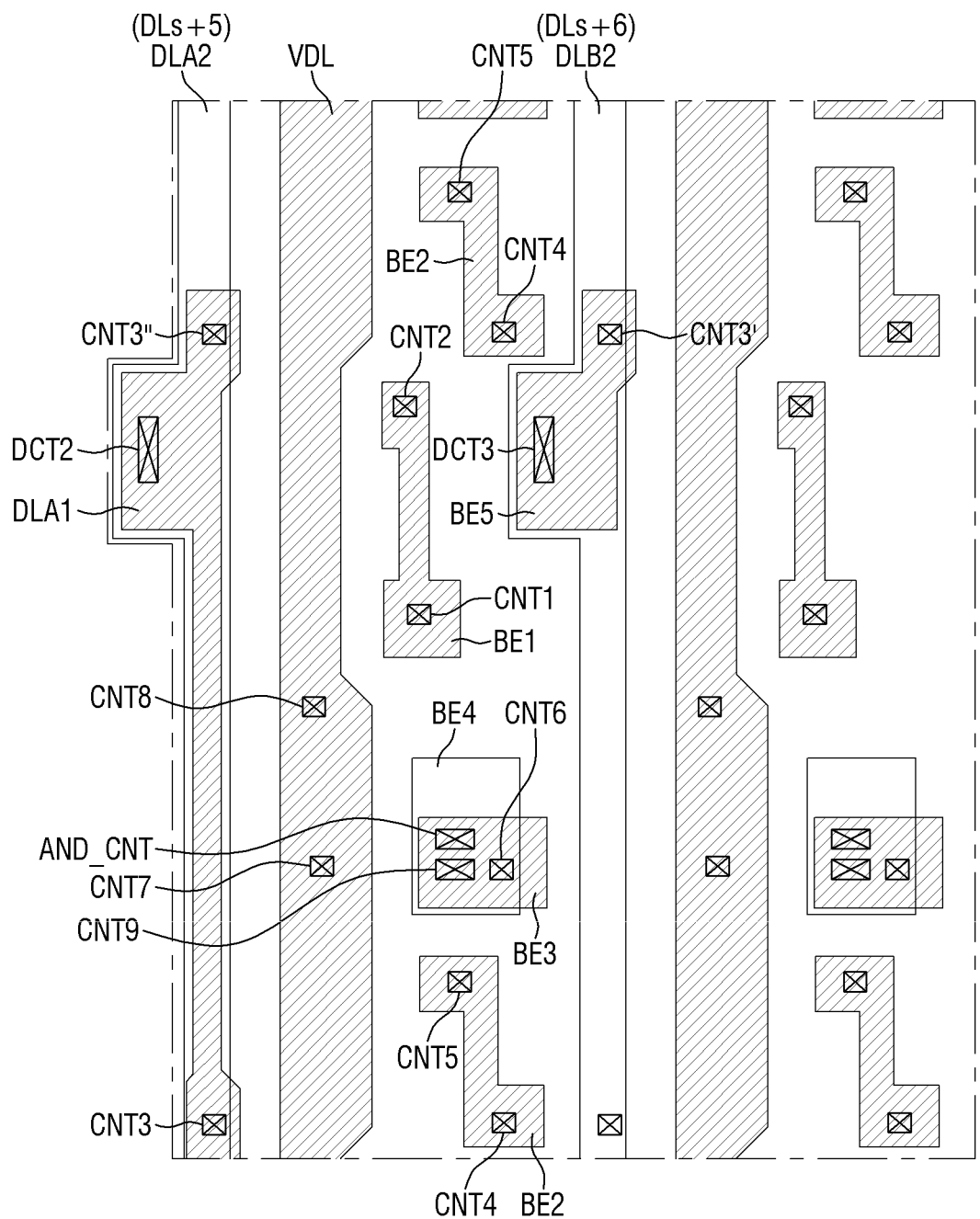
FIG. 19 is a plan view illustrating first and second data metal layers of FIG. 18.

FIG. 18 is a plan view illustrating another example of the area C1 of FIG. 7. FIG. 19 is a plan view illustrating first and second source data layers of FIG. 18.

The embodiment of FIGS. 18 and 19 differs from the embodiment of FIGS. 8A and 9 in that the (s+5)-th data line DLs+5 includes only the 2A-th data line DLA2 in the pixel area PXA and includes only the 1A-th data line DLA1 in the wiring area LA, and that the (s+6)-th data line DLs+6 includes only the 2B-th data line DLB2. The embodiment of FIGS. 18 and 19 will hereinafter be described, focusing mainly on the differences with the embodiment of FIGS. 8A and 9.

Referring to FIGS. 18 and 19, the (s+5)-th data line DLs+5 may include the 2A-th data line DLA2 in the pixel area PXA. In this case, in each pixel PX adjacent to the wiring area LA, the 2A-th data line DLA2 may be connected to the 1A-th data line DLA1 via the second data contact hole DCT2. On the other hand, in each pixel PX not adjacent to the wiring area LA, the 2A-th data line DLA2 may be connected to a second data bridge electrode via the second data contact hole DCT2. The second data bridge electrode may be formed to be substantially the same as the first data bridge electrode BE5. The second data bridge electrode or the 1A-th data line DLA1 may be connected to the sixth source electrode S6 of the sixth switching transistor ST6 through a third contact hole CNT3".

The (s+6)-th data line DLs+6, which is adjacent to the (s+5)-th data line DLs+5, includes only the 2B-th data line DLB2. In this case, the 2B-th data line DLB2 may be connected to the first data bridge electrode BE5 through the third data contact hole DCT3, and the first data bridge electrode BE5 may be connected to the sixth source electrode S6 of the sixth switching transistor ST6 through the third contact hole CNT3'.

The 1A-th data line DLA1, the first power supply voltage line VDL, the first bridge electrode BE1, the second bridge electrode BE2, the third bridge electrode BE3, the first data bridge electrode BE5, and the second data bridge electrode may be formed as a first data layer. On the other hand, the 2A-th data line DLA2, the 2B-th data line DLB2, and the fourth bridge electrode BE4 may be formed as a second data layer, which is located in a different layer from the first data layer.

The (s+5)-th data line DLs+5 includes only the 2A-th data line DLA2 in the pixel area PXA and includes only the 1A-th data line DLA1 in the wiring area LA. The (s+6)-th data line DLs+6 includes only the 2B-th data line DLB2 in both the pixel area PXA and the wiring area LA. In order to minimize the size of the wiring area LA, the distance between the (s+5)- and (s+6)-th data lines DLs+5 and DLs+6 may be set to be smaller in the wiring area LA than in the pixel area PXA. Also, in the wiring area LA, the (s+5)- and (s+6)-th data lines DLs+5 and DLs+6 may be arranged to overlap with each other.

Because the (s+5)-th data line DLs+5 includes the 2A-th data line DLA2 in the pixel area PXA and the 1A-th data line DLA1 in the wiring area LA and the (s+6)-th data line DLs+6 includes the 2B-th data line DLB2 in both the pixel area PXA and the wiring area LA, any difference in wiring resistance between the (s+5)- and (s+6)-th data lines DLs+5 and DLs+6 can be minimized. That is, any difference in RC time constant between the (s+5)- and (s+6)-th data lines DLs+5 and DLs+6 can be minimized.

FIGS. 18 and 19 illustrate the (s+5)-th data line DLs+5 includes the 2A-th data line DLA2 in the pixel area PXA and the 1A-th data line DLA1 in the wiring area LA, and that the (s+6)-th data line DLs+6 includes the 2B-th data line DLB2 in both the pixel area PXA and the wiring area LA, but the present disclosure is not limited thereto. Alternatively, each odd-numbered data line may include the 2A-th data line DLA2 in the pixel area PXA and the 1A-th data line DLA1 in the wiring area LA, and each even-numbered data line may include the 2B-th data line DLB2 in both the pixel area PXA and the wiring area LA.

In the embodiment of FIGS. 18 and 19, between a pair of adjacent data lines, a first data line includes the 2A-th data line DLA2, which is located in the second data layer, in the pixel area PXA and includes the 1A-th data line DLA1, which is located in the first data layer, in the wiring area LA, and a second data line includes the 2B-th data line DLB2, which is located in the second data layer. Particularly, in the wiring area LA, the first data line includes only the 1A-th data line DLA1, and the second data line includes only the 2B-th data line DLB2. Thus, the first and second data lines do not need any bridge electrodes in the wiring area LA. Accordingly, the load of the first and second data lines can be prevented from increasing due to the presence of bridge electrodes. Also, any difference between the load of the first and second data lines that pass through the wiring area LA and the load of data lines that do not pass through the wiring area LA can be minimized. Here, the first and second data lines may be the (s+5)- and (s+6)-th data lines DLs+5 and DLs+6, respectively.

FIG. 18 illustrates that the first data bridge electrode BE5 is connected to the 2B-th data line DLB2 through a single third data contact hole DCT3, and that the 2A-th data line DLA2 or the second data bridge electrode is connected to the 1A-th data line DLA1 through a single second data contact hole DCT2, but the present disclosure is not limited thereto. Alternatively, the first data bridge electrode BE5 may be connected to the 2B-th data line DLB2 through a plurality of third data contact holes. Similarly, the 2A-th data line DLA2 or the second data bridge electrode may be connected to the 1A-th data line DLA1 through a plurality of second data contact holes DCT2. In this case, at least one of the plurality of third data contact holes DCT3 may be arranged to overlap with at least one of the first gate electrode G1, the first active layer ACT1, the first source electrode S1, and the first drain electrode D1 of the first switching transistor ST1, and at least one of the plurality of second data contact holes DCT2 may also be arranged to overlap with at least one of the first gate electrode G1, the first active layer ACT1, the first source electrode S1, and the first drain electrode D1 of the first switching transistor ST1.

While embodiments are described above, it is not intended that these embodiments describe all possible forms of the inventive concept of the present disclosure. Rather, the words used in the specification are words of description rather than limitation, and it is understood that various changes may be made without departing from the spirit and scope of the inventive concept of the present disclosure. Additionally, the features of various implementing embodiments may be combined to form further embodiments of the present disclosure. Thus, embodiments according to the present invention are defined by the following claims and their equivalents.

What is claimed is:

1. A display device comprising:
a first substrate having a through hole area where a through hole is formed, a wiring area surrounding the through hole area, and a pixel area where a plurality of pixels are arranged to surround the wiring area;
first and second data lines on the first substrate to be adjacent to each other; and
a bridge electrode electrically connected to the second data line, and
wherein each of the plurality of pixels comprises:
an organic light-emitting diode (OLED) comprising a first electrode, a second electrode, and an organic light-emitting layer between the first electrode and the second electrode;
a driving transistor configured to provide a driving current to the OLED; and
a first transistor comprising a source electrode connected to the bridge electrode through a first contact hole, and a drain electrode connected to a source electrode of the driving transistor, and
wherein the first data line comprises a first metal layer in both the pixel area and the wiring area, and
the second data line comprises a second metal layer in both the pixel area and the wiring area, and
wherein a first insulating film is between the first metal layer and the second metal layer and between the bridge electrode and the second metal layer, and
wherein the second metal layer of the second data line is connected to the bridge electrode through a second contact hole penetrating the first insulating film, and
wherein the first metal layer of the first data line has a same material with the bridge electrode.

2. The display device of claim 1, wherein a second insulating film is between the bridge electrode and the source electrode of the first transistor, and
wherein the first contact hole is penetrating the second insulating film, and
wherein an area of the second contact hole is larger than an area of the first contact hole.

3. The display device of claim 1, wherein each of the plurality of pixels further comprises:

a second switching transistor between a gate electrode and a drain electrode of the driving transistor.

4. The display device of claim 3, wherein the second metal layer of the second data line overlaps at least one of a gate electrode, an active layer, a source electrode, and a drain electrode of the second switching transistor in a plan view.

5. The display device of claim 3, wherein the bridge electrode overlaps at least one of a gate electrode, an active layer, a source electrode, and a drain electrode of the second switching transistor in a plan view.

6. The display device of claim 3, wherein the second contact hole overlaps at least one of a gate electrode, an active layer, a source electrode, and a drain electrode of the second switching transistor in a plan view.

7. The display device of claim 3, wherein the second switching transistor comprises two switching transistors connected in series, each of the two switching transistors comprises a gate electrode, an active layer, a source electrode, and a drain electrode.

8. The display device of claim 7, wherein the second metal layer of the second data line overlaps at least one of the gate electrode, the active layer, the source electrode, and the drain electrode of one switching transistor among the two switching transistors in a plan view.

9. The display device of claim 7, wherein the bridge electrode overlaps at least one of the gate electrode, the active layer, the source electrode, and the drain electrode of one switching transistor among the two switching transistors in a plan view.

10. The display device of claim 7, wherein the second contact hole overlaps at least one of the gate electrode, the active layer, the source electrode, and the drain electrode of one switching transistor among the two switching transistors in a plan view.

11. An electronic device comprising:
a display panel; and
a main processor configured to output digital video data for displaying an image into the display panel, and
wherein the display panel comprises:
a first substrate having a through hole area where a through hole is formed, a wiring area surrounding the through hole area, and a pixel area where a plurality of pixels are arranged to surround the wiring area;
first and second data lines on the first substrate to be adjacent to each other; and
a bridge electrode electrically connected to the second data line, and
wherein each of the plurality of pixels comprises:
an organic light-emitting diode (OLED) comprising a first electrode, a second electrode, and an organic light-emitting layer between the first electrode and the second electrode;
a driving transistor configured to provide a driving current to the OLED; and
a first transistor comprising a source electrode connected to the bridge electrode through a first contact hole, and a drain electrode connected to a source electrode of the driving transistor, and wherein the first data line comprises a first metal layer in both the pixel area and the wiring area, and
the second data line comprises a second metal layer in both the pixel area and the wiring area, and
wherein a first insulating film is between the first metal layer and the second metal layer and between the bridge electrode and the second metal layer, and
wherein the second metal layer of the second data line is connected to the bridge electrode through a second contact hole penetrating the first insulating film, and
wherein the first metal layer of the first data line has a same material with the bridge electrode.

12. The electronic device of claim 11, wherein the display panel is applied to a smartphone, a tablet personal computer (PC), a personal digital assistant (PDA), a portable multimedia player (PMP), a gaming console, a wristwatch-type electronic device, a television (TV), an outdoor billboard, a monitor, a notebook computer, a car navigation device, or a camera.

13. The electronic device of claim 11, further comprising:
an image sensor overlapping the through hole of the display panel.

14. The electronic device of claim 11, wherein a second insulating film is between the bridge electrode and the source electrode of the first transistor, and
wherein the first contact hole is penetrating the second insulating film, and
wherein an area of the second contact hole is larger than an area of the first contact hole.

15. The electronic device of claim 11, wherein each of the plurality of pixels further comprises:
a second switching transistor between a gate electrode and a drain electrode of the driving transistor.

16. The electronic device of claim 15, wherein the second metal layer of the second data line overlaps at least one of a gate electrode, an active layer, a source electrode, and a drain electrode of the second switching transistor in a plan view.

17. The electronic device of claim 15, wherein the bridge electrode overlaps at least one of a gate electrode, an active layer, a source electrode, and a drain electrode of the second switching transistor in a plan view.

18. The electronic device of claim 15, wherein the second contact hole overlaps at least one of a gate electrode, an active layer, a source electrode, and a drain electrode of the second switching transistor in a plan view.

19. The electronic device of claim 15, wherein the second switching transistor comprises two switching transistors, each of the two switching transistors comprises a gate electrode, an active layer, a source electrode, and a drain electrode.

20. The electronic device of claim 19, wherein the second metal layer of the second data line overlaps at least one of the gate electrode, the active layer, the source electrode, and the drain electrode one switching transistor among the two switching transistors in a plan view.

* * * * *